United States Patent [19]
Fukunaga et al.

[11] Patent Number: 6,049,117
[45] Date of Patent: *Apr. 11, 2000

[54] LIGHT-RECEIVING ELEMENT

[75] Inventors: Naoki Fukunaga, Tenri; Masaru Kubo, Nara-ken, both of Japan

[73] Assignee: Sharp Kabushiki Kaisha, Osaka, Japan

[*] Notice: This patent issued on a continued prosecution application filed under 37 CFR 1.53(d), and is subject to the twenty year patent term provisions of 35 U.S.C. 154(a)(2).

[21] Appl. No.: 08/717,347

[22] Filed: Sep. 20, 1996

[30] Foreign Application Priority Data

Sep. 26, 1995 [JP] Japan .................................... 7-248142
Jun. 26, 1996 [JP] Japan .................................... 8-166284

[51] Int. Cl.[7] .......................... H01L 31/00; H01L 31/06; H01L 29/80; H01L 31/112
[52] U.S. Cl. .......................... 257/446; 257/257; 257/258; 257/443; 257/461
[58] Field of Search .................................. 257/225, 257, 257/258, 443, 444, 446, 461, 464

[56] References Cited

U.S. PATENT DOCUMENTS

| 4,831,430 | 5/1989 | Umeji ....................................... 257/463 |
| 4,951,104 | 8/1990 | Kato et al. ............................... 257/230 |
| 5,177,581 | 1/1993 | Kubo et al. . |
| 5,210,434 | 5/1993 | Ohmi et al. ............................... 257/291 |
| 5,485,027 | 1/1996 | Williams et al. ......................... 257/343 |
| 5,602,415 | 2/1997 | Kubo et al. ............................... 257/443 |
| 5,614,740 | 3/1997 | Gardner et al. .......................... 257/222 |

FOREIGN PATENT DOCUMENTS

| 0 405 670 A1 | 1/1991 | European Pat. Off. . |
| 0 660 414 A1 | 6/1995 | European Pat. Off. . |
| 0 693 785 A1 | 1/1996 | European Pat. Off. . |
| 56-60054 | 5/1981 | Japan . |
| 61154063 | 7/1986 | Japan . |
| 63055982 | 3/1988 | Japan . |
| 63-122164 | 5/1988 | Japan . |
| 04082268 | 3/1992 | Japan . |
| 4-180269 | 6/1992 | Japan . |
| 04271172 | 9/1992 | Japan . |
| 6-44618 | 6/1994 | Japan . |
| 07183563 | 7/1995 | Japan . |

OTHER PUBLICATIONS

Patent Abstracts of Japan, vol. 013, No. 509 (E–846), Nov. 15, 1989 & JP 01 205565 A (Hamamatsu Photonics KK), Aug. 17, 1989, *Abstract*.
Patent Abstracts of Japan, vol. 018, No. 629 (E–1637), Nov. 30, 1994 & JP 06 244454 A (Mitsubishi Electric Corp.), Sep. 2, 1994, *Abstract*.

*Primary Examiner*—Mahshid Saadat
*Assistant Examiner*—Allan R. Wilson
*Attorney, Agent, or Firm*—Nixon & Vanderhye P.C.

[57] ABSTRACT

A light-receiving element includes a semiconductor substrate of a first conductivity type; a first semiconductor layer of a second conductivity type which is formed in a predetermined region on a surface of the semiconductor substrate of the first conductivity type; and at least one semiconductor region of the first conductivity type which is formed so as to extend from an upper surface of the first semiconductor layer of the second conductivity type to the surface of the semiconductor substrate of the first conductivity type, thereby dividing the first semiconductor layer of the second conductivity type into a plurality of semiconductor regions of the second conductivity type. In the light-receiving element, a specific resistance of the semiconductor substrate of the first conductivity type is set in a predetermined range such that a condition $Xd \geq Xj$ is satisfied between a depth $Xd$ of a depletion layer to be formed in the semiconductor substrate of the first conductivity type upon an application of an inverse bias and a diffusion depth $Xj$ of the semiconductor region of the first conductivity type into the semiconductor substrate of the first conductivity type.

26 Claims, 17 Drawing Sheets

LIGHT-RECEIVING ELEMENT

BACKGROUND OF THE INVENTION

1. Field of the Invention

The present invention relates to a an integrated circuit (IC) light-receiving element in which a circuit for processing a photoelectrically converted signal is integrated. More particularly, the present invention relates to a structure for improving the response speed of a light-receiving element such as a divided photodiode element usable for an optical pickup and the like.

2. Description of the Related Art

An optical pickup has heretofore been used for various kinds of optical disk devices including a CD-ROM, a digital video disk (DVD) and the like. In recent years, CD-ROM devices have been developed more and more actively and rapidly so as to have an even higher response speed. Currently, CD-ROM devices having a 4× to 6× response speed (i.e, a response speed 4 to 6 times as high as a normal response speed) have been put on the market. Furthermore, CD-ROM devices having a 8× to 12× response speed have been developed to be commercialized in the near future. DVD have also been developed remarkably. In a DVD, it is possible to gain access to data stored therein at a response speed approximately as high as 6× response speed of a CD-ROM. It is very probable that a DVD having a response speed twice as high as that of a currently available DVD would be developed in the near future.

Furthermore, such optical disk devices are now required to process a large amount of data necessary for storing a motion picture and the like. In view of these circumstances, it is an urgent task to realize a high response speed for an optical pickup.

A divided photodiode element, in which a light-receiving region is divided into a plurality of light detection areas, has conventionally been used as a signal detector element for an optical pickup.

As a high-performance optical disk device of a smaller size has been realized in recent years, it has become more and more important to reduce the size and the weight of an optical pickup. In order to realize such an optical pickup, an optical module, in which a tracking beam generation function, a light branching function and an error signal generation function are integrated into one hologram element and a laser diode and a divided photodiode element are provided within a package, has been proposed.

FIG. 7 schematically shows an exemplary arrangement for such an optical system 1000 for optical pickup. Hereinafter, it will be briefly described how the optical system 1000 detects a signal in principle.

Light emitted from a laser diode 110 is incident onto a hologram element (the external configuration of the element is not shown in FIG. 7) having a diffraction grating 120 and a hologram 130 which are formed on the lower surface and the upper surface thereof, respectively. The light emitted from the laser diode 110 is separated by the diffraction grating 120 formed on the lower surface of the hologram element for generating a tracking beam. The tracking beam is split into three optical beams consisting of two sub-beams used for tracking and one main beam for reading out an information signal. Then, the light beams are transmitted through the hologram 130 formed on the upper surface of the hologram element as zero-order light, transformed by a collimator lens 140 into parallel light beams and then condensed by an objective lens 150 onto a disk 160.

The condensed light is modulated and reflected by the pits formed on the disk 160; transmitted through the objective lens 150 and the collimator lens 140; and then diffracted by the hologram 130 so as to be guided as first-order diffracted light beams onto a divided photodiode element 170, on which five divided light-detecting photodiode sections D1 to D5 (hereinafter, simply referred to as "light-detecting sections") are formed. In this case, the divided photodiode element 170 functions as a light-receiving element in the optical system 1000 for optical pickup.

The hologram 130 includes two regions having respectively different diffraction periods. When the reflected light beam of the main beam is incident onto one of the two regions, the light beam is condensed onto a linear isolating section between the light-detecting sections D2 and D3. On the other hand, when the reflected light beam of the main beam is incident onto the other region of the hologram 130, the light beam is condensed onto the light-detecting section D4. The reflected light beams of the two sub-beams are condensed onto the light-detecting sections D1 and D5, respectively.

In the optical system 1000, the incidence positions of the main beam on the divided photodiode element 170 is moved along the direction perpendicular to the longitudinal direction of the light-detecting sections D2 and D3 in accordance with the variation of the distance between the hologram 130 and the disk 160. In the case where the ma in beam is in focus on the disk 160, the reflected light beam thereof is incident onto the isolating section between the light-detecting sections D2 and D3. Thus, assuming that the outputs of the light-detecting sections D1 to D5 of the divided photodiode element 170 are denoted by S1 to S5, respectively, a focusing error signal FES is given based on the equation: FES=S2−S3.

On the other hand, a tracking error is detected by a so-called three-beam method. Since the two, sub-beams for tracking are condensed onto the light-detecting sections D1 and D5, respectively, a tracking error signal TES is given based on the equation: TES =S1−S5. Thus, when the tracking error signal TES is zero, the main beam is correctly located on the target track to be irradiated by the main beam.

Furthermore, a reproduced signal RF is given as a sum of the outputs of the light-detecting sections D2 to D4 for receiving the reflected light beam of the main beam based on the equation: RF=S2+S3+S4.

FIG. 8 shows a plan view of the divided photo-diode element 170 of the optical system 1000.

In the divided photodiode element 170, five light-detecting sections D1 to D5 are formed within an elongated region, as described above. In addition, as shown in FIG. 8, a pair of anode electrodes 172a and 172b which are commonly used for all of the light-detecting sections D1 to D5 and five cathode electrodes 174a to 174e corresponding to the five light-detecting sections D1 to D5, respectively, are disposed so as to surround the region in which the light-detecting sections D1 to D5 are provided.

The shape of the divided photodiode element 170 is determined by the optical system 1000. As shown in FIG. 8, all of the light-detecting sections D1 to D5 have an elongated shape. The reason is as follows.

In assembling the optical system 1000, after the laser diode 110 and the divided photodiode element 170 are incorporated into one package, the hologram element having the hologram 130 and the diffraction grating 120 is adhered to the upper surface of the package. During this assembly, an error is likely to be caused in aligning the positions of the laser diode 110 and the divided photodiode element 170. In addition, the oscillation wavelength of the laser diode 110 is variable not only among the individual products thereof but also in accordance with the variation in the temperature. Because of these reasons, the diffraction angle of the diffracted light is varied, so that the incidence position of the diffracted light deviates in some cases. In order to deal with such problems, the light-receiving planes of the divided photodiode element 170 are required to have a longer side along the Y direction shown in FIG. 8, i.e., a direction along which the incidence position of the diffracted light is moved in accordance with the variation in the diffraction angle.

On the other hand, in the X direction shown in FIG. 8, the diffraction angle of the diffracted light is not affected by the variation in the oscillation wavelength which results from the variation in the oscillation wavelength of the laser diode 110 among the individual products thereof or the variation in the oscillation wavelength caused by the variation in the temperature. In addition, an error caused when the positions of the laser diode 110 and the divided photodiode element 170 are aligned can be compensated for by rotating the hologram element to be adhered to the upper surface of the package. Thus, the light-receiving planes of the divided photodiode element 170 are not required to have a longer side along the X direction. To the contrary, if the distance between adjacent ones of the three light beams to be incident in parallel to each other along the X direction is large, then it is difficult to adjust the position of the optical pickup to be incorporated into the optical disk device. Thus, regarding the X direction, the widths of the light-detecting sections D1 to D5 and the widths of the isolating sections among the light-detecting sections D1 to D5 are required to be small.

In view of the above-described respects, the shape of the divided photodiode element 170 necessarily becomes elongated.

FIG. 9 shows a schematic cross-sectional view of a conventional light-detecting divided photodiode element 170 as seen along the line IX—IX shown in FIG. 8. It is noted that various components including a multi-layer wiring, a protective film and the like to be formed during the respective steps succeeding a metal wiring processing step are omitted in FIG. 9.

Hereinafter, a method for fabricating the divided photodiode element 170 will be described with reference to the cross-sectional views illustrated as FIG. 10A to 10D. In FIG. 9 and FIGS. 10A to 10D, the same components are identified by the same reference numerals.

First, P-type buried diffusion regions 2 are formed in the regions in the vicinity of the surface of a P-type semiconductor substrate 1 which are to be the isolating sections for isolating the light-detecting sections D1 to D5 from each other (FIG. 10A).

Next, as shown in FIG. 10B, an N-type epitaxially grown layer 4 (hereinafter, simply referred to as an "N-type epi-layer") is formed over the entire surface of the P-type semiconductor substrate 1. Then, P-type isolating diffusion regions 5 are formed in the respective regions inside the N-type epi-layer 4 so as to correspond to the P-type buried diffusion regions 2. The P-type isolating diffusion regions 5 are formed so as to vertically extend from the surface of the N-type epi-layer 4 to reach the upper surface of the P-type semiconductor substrate 1 (or the surfaces of the P-type buried diffusion regions 2). As a result, the N-type epi-layer 4 is divided into a plurality of electrically isolated N-type semiconductor regions, so that the respective light-detecting sections D1 to D5 are formed as shown in FIG. 10C (though the light-detecting section D4 is not shown in FIG. 10C).

Thereafter, as shown in FIG. 10C, a P-type diffusion layer 6 is formed in the surface region of the N-type epi-layer 4 between the P-type isolating diffusion region 5 on the right end and the P-type isolating diffusion region 5 on the left end so as to cover at least a portion of the upper surfaces of the P-type isolating diffusion regions 5 to be the isolating sections of the light-detecting sections D1 to D5, respectively.

Subsequently, as shown in FIG. 10D, the portion of an oxide film 7 which is formed on the surface of the P-type diffusion layer 6 and the N-type epi-layer 4 when the P-type diffusion layer 6 is formed and which corresponds to the light-receiving region on the surface of the P-type diffusion layer 6 is removed, and a nitride film 8 is formed instead above the semiconductor substrate 1. The film thickness of the nitride film 8 is set in accordance with the wavelength of the laser diode so as to function as an antireflection film.

Next, electrode windows are opened through the oxide film 7 and the nitride film 8. Then electrode wirings 9a are formed, and simultaneously, metal films 9 are formed on the portions on the surface of the nitride film 8 onto which the signal light is not irradiated, whereby the structure shown in FIG. 9 for the divided photodiode element 170 is obtained. A signal processor section (not shown) is formed on the semiconductor substrate 1 by performing an ordinary bipolar IC process.

In the respective light-detecting sections D1 to D5, when an inverse bias is applied thereto, a depletion layer 11 is formed in the vicinity of the surface of the substrate 1 as shown in FIG. 9.

In the divided photodiode element 170, the P-N junction in each isolating section between adjacent ones of the light-detecting sections D1 to D5 is covered with the P-type diffusion layer 6. As a result, even if the nitride film 8 is directly formed on the surface of the divided photodiode element 170, problems such as an increase in the junction leakage are not caused. Therefore, the condensed beam of the light reflected by the disk 160 (hereinafter, such reflected light will be referred to as "diffracted light" because the reflected light is also diffracted by the hologram 130) is not reflected so much by the light-receiving plane even in the isolating section between the light-detecting sections D2 and D3, onto which the condensed beam is actually incident. As a result, the sensitivity of the divided photodiode 170 can be improved.

In addition, since metal films 9 are formed in the sections onto which the light beams of the diffracted light are not incident (i.e., an isolating section between the light-detecting sections D1 and D2 and an isolating section between the light-detecting sections D3 and D5, in this case), the divided photodiode element 170 is less likely to be affected by the stray light or the like, so that an S/N ratio of the divided photodiode element 170 can be improved.

A high-speed operation is required, in particular, for the light-detecting sections D2, D3 and D4 for processing the reproduced signal RF. In the case where a light beam is irradiated onto the isolating section between these light-detecting sections D2 and D3, the cutoff frequency of the divided photodiode element 170, in particular, is decreased as compared with the case where light beams are irradiated onto the centers of the respective light-detecting sections.

The experimental results demonstrating the decrease in the cutoff frequency of the divided photodiode element 170 are shown in FIGS. 11A and 11B. FIG. 11A is a cross-sectional view showing the vicinity of the light-detecting sections D2 and D3 of the divided photodiode element 170 shown in FIG. 9. FIG. 11B is a graph representing the dependence of the cutoff frequency of the divided photodiode element 170 upon the position of the light beam. In FIG. 11B, the abscissas represent the positions of the light beam of the diffracted light in the vicinity of the light-detecting sections D2 and D3, while the ordinates represent the cutoff frequencies fc (MHz) at the respective positions. As shown in FIG. 11B, when the light beam is located in the vicinity of the isolating section between the light-detecting sections D2 and D3, the cutoff frequency fc is decreased.

In this case, the specific resistance of the P-type semiconductor substrate 1 is set to be 15 Ωcm and the cutoff frequency is measured under the conditions where the inverse bias to be applied to the photodiode element 170 is set to be 1.5 V and the load resistance is set to be 380 Ω. On the other hand, since the light used for a CD-ROM has a wavelength λ of 780 nm and the light used for a DVD has a wavelength λ of 635 nm, the cutoff frequencies of the photodiode element corresponding to these two wavelengths are measured as the experimental results.

As shown in FIG. 11B, since the response speed of the element corresponds to a cutoff frequency on the order of several MHz with respect to the light having a wavelength of 780 nm when light is irradiated onto the isolating section, the element is operable with an optical disk device for a 4× CD-ROM in view of the performance thereof. However, the element cannot be operated in association with a CD-ROM having a 6× or higher response speed.

On the other hand, since the response speed of the element corresponds to a cutoff frequency of 20-odd MHz with respect to the light having a wavelength of 635 nm when light is irradiated onto the isolating section, the element is operable with a DVD having a normal response speed. However, since a 2× DVD requires a photodiode element to have a cutoff frequency of 30 MHz or higher, a divided photodiode element having an element structure shown in FIG. 9 cannot be operated in association with a 2× DVD.

The state where a light beam has been irradiated onto the isolating section between the light-detecting sections D2 and D3 was analyzed by utilizing a device simulation. As a result, it was confirmed that the optical carriers made a detour around the P-type buried diffusion region 2 in the isolating section so as to reach the junction section between the N-type epi-layer 4 and the P-type semiconductor substrate 1. When the optical carriers follow such a detour, the diffusion movement distance of the optical carriers becomes longer, thereby causing the above-described decrease in the cutoff frequency.

In addition, a difference exists between the response speed corresponding to the light having a wavelength of 780 nm and the response speed corresponding to the light having a wavelength of 635 nm as shown in FIG. 11B, because the penetration length of the light (i.e., the penetration depth of the light into the substrate) is varied in accordance with the wavelength thereof. The light having a wavelength of 635 nm has more satisfactory response characteristics, because the light has a shorter penetration length and a shorter diffusion movement distance of the optical carriers.

FIG. 12 shows the results of the simulation for obtaining the current paths in the P-type buried diffusion region 2 corresponding to the isolating section between the light-detecting sections D2 and D3 and in the vicinity of the isolating section, in which the directions of the currents are indicated by arrows. The electrons functioning as optical carriers move in the opposite directions to those indicated by the arrows shown in FIG. 12.

FIG. 13 is a graph showing the potential distribution of the P-type isolating diffusion region 5 in the isolating section between adjacent light-detecting sections in the depth direction. As shown in FIG. 13, the potential distribution functions as a potential barrier with respect to the electrons or the optical carriers moving in the substrate 1 toward the surface region thereof. Therefore, as shown in FIG. 12, the optical carriers move while making a detour around the P-type buried diffusion region 2.

As described above, the specific resistance of an ordinarily used P-type semiconductor substrate 1 is about 15 Ωcm. Thus, in the case where the inverse bias to be applied to the light-detecting photodiode sections constituting the respective light-detecting sections is 1.5 V, the depth Xj (or the diffusion depth into the P-type semiconductor substrate 1) of a P-type buried diffusion region 2 is about 2.5 μm, whereas the depth Xd of a depletion layer 11 is no greater than about 1.7 μm, as shown in FIG. 9. As a result, the optical carriers run a distance of about 10-odd μm while making a detour, as shown in FIG. 12.

SUMMARY OF THE INVENTION

The light-receiving element of the invention includes: a semiconductor substrate of a first conductivity type; a first semiconductor layer of a second conductivity type which is formed in a predetermined region on a surface of the semiconductor substrate of the first conductivity type; and at least one semiconductor region of the first conductivity type which is formed so as to extend from an upper surface of the first semiconductor layer of the second conductivity type to the surface of the semiconductor substrate of the first conductivity type, thereby dividing the first semiconductor layer of the second conductivity type into a plurality of semiconductor regions of the second conductivity type. In the light-receiving element, a specific resistance of the semiconductor substrate of the first conductivity type is set in a predetermined range such that a condition $Xd \geq Xj$ is satisfied between a depth Xd of a depletion layer to be formed in the semiconductor substrate of the first conductivity type upon an application of an inverse bias and a diffusion depth Xj of the semiconductor region of the first conductivity type into the semiconductor substrate of the first conductivity type.

In one embodiment, a plurality of second semiconductor regions of the second conductivity type are buried in the semiconductor substrate of the first conductivity type so as to correspond to the plurality of divided semiconductor regions of the second conductivity type, respectively.

In another embodiment, a predetermined circuit element is formed in a region other than the predetermined region on the surface of the semiconductor substrate of the first conductivity type.

In still another embodiment, a light-detecting photodiode section for detecting signal light is formed by each of the plurality of divided semiconductor regions of the second conductivity type and a region of the semiconductor substrate of the first conductivity type which corresponds to and underlies the semiconductor region of the second conductivity type.

In still another embodiment, the specific resistance of the semiconductor substrate of the first conductivity type is in a range from about 30 Ωcm to about 1000 Ωcm.

In still another embodiment, the light-receiving element has a response speed of about 14 MHz or higher.

In still another embodiment, the light-receiving element has a response speed of about 30 MHz or higher.

Hereinafter, the functions or the effects to be attained by the present invention will be described.

By increasing the specific resistance of the semiconductor substrate of the first conductivity type in the case where light is irradiated onto an isolating section of a divided photodiode element, the width (and/or the depth) of the depletion layer to be formed can be increased. As a result, the lower end of a depletion layer can be located at a position deeper than the lower end of a P-type buried diffusion region. As a result, though the optical carriers move while making a detour around a P-type buried diffusion region in a divided photodiode device having a conventional configuration, such a detour of the optical carriers can be suppressed and the diffusion movement distance thereof can be shortened according to the present invention. Consequently, the response speed and the cutoff frequency characteristics of a divided photodiode element can be improved.

Thus, the invention described herein makes possible the advantage of increasing the response speed of a light-receiving element, such as a divided photodiode element, particularly used for an optical system for optical pickup including a hologram element, in a state where a light beam is irradiated onto an isolating section between adjacent light-detecting sections.

This and other advantages of the present invention will become apparent to those skilled in the art upon reading and understanding the following detailed description with reference to the accompanying figures.

BRIEF DESCRIPTION OF THE DRAWINGS

FIG. 4A is a cross-sectional view showing a part of the light-receiving element shown in FIG. 2, while

FIG. 11A is a cross-sectional view showing a part of the conventional light-receiving element shown in FIG. 9, while

FIG. 14A is a view showing a cross-sectional structure in the vicinity of the light-detecting sections D2 and D3 of the divided photodiode element 100 shown in FIG. 1; while FIG. 14B is a graph representing the dependence of the cutoff frequency of the divided photodiode element 100 upon the position of the light beam.

FIG. 15A is a view showing a cross-sectional structure in the vicinity of the light-detecting sections D2 and D3 of the divided photodiode element 250 shown in FIG. 6; while FIG. 15B is a graph representing the dependence of the cutoff frequency of the divided photodiode element 250 upon the position of the light beam.

DESCRIPTION OF THE PREFERRED EMBODIMENTS

EXAMPLE 1

Hereinafter, a divided photodiode element 100, i.e., a light-receiving element in a first example of the present invention will be described with reference to the drawings.

Figure 1:
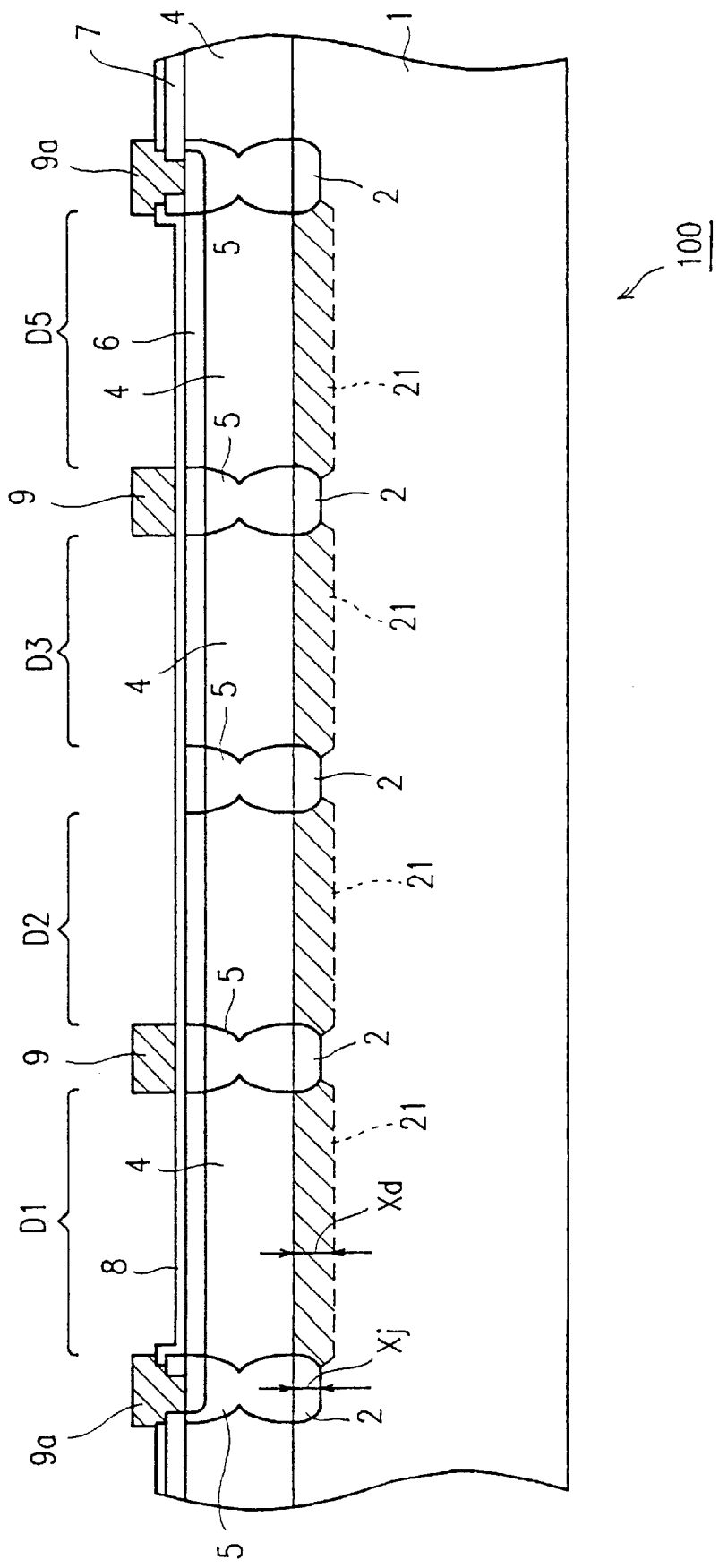
FIG. 1 is a cross-sectional view showing a structure of a light-receiving element in a first example of the present invention.

FIG. 1 is a cross-sectional view of the divided photodiode element 100. It is noted that various components including a multi-layer wiring, a protective film and the like to be formed during the respective steps succeeding a metal wiring processing step are omitted in FIG. 1.

In the divided photodiode element 100, an N-type epi-layer 4 is formed on a P-type semiconductor substrate 1, e.g., a silicon substrate. In the N-type epi-layer 4, a plurality of P-type isolating diffusion regions 5 are formed so as to vertically extend from the surface of the N-type epi-layer 4. In the surface region of the semiconductor substrate 1, a plurality of P-type buried diffusion regions 2 are formed at the respective positions so as to face the P-type isolating diffusion regions 5. The N-type epi-layer 4 is divided into a plurality of regions by these diffusion regions 2 and 5. A plurality of light-detecting sections (or light-detecting photodiode sections) D1 to D5 (though D4 is not shown in FIG.

1) for detecting signal light are formed by the respective N-type semiconductor regions obtained by dividing the N-type epi-layer 4 in this manner and the corresponding portion of the underlying substrate 1.

In each of the light-detecting sections D1 to D5, when an inverse bias is applied thereto, a depletion layer 21 is formed in the vicinity of the surface of the substrate 1. Herein, the divided photodiode element 100 according to the present invention is different from the conventional divided photodiode element 170 in that the element 100 is configured such that the lower end of a depletion layer 21 is located deeper in the substrate 1 than the lower end of a corresponding P-type buried diffusion region 2.

Since the method for fabricating the divided photodiode element 100 is fundamentally the same as the method for fabricating the conventional divided photodiode element 170 which has already been described with reference to FIGS. 10A to 10D, a detailed description thereof will be omitted herein.

The divided photodiode element 100 according to the present invention differs greatly from the conventional divided photodiode element 170 in the specific resistance of the P-type semiconductor substrate 1. More specifically, in the divided photodiode element 100 according to the present invention, the specific resistance of the P-type semiconductor substrate 1 is set so as to satisfy the following relationship:

$$Xd \geq Xj$$

where Xd represents the depth of the depletion layer 21 expanding in the surface region of the substrate 1 upon the application of an inverse bias to the light-detecting sections D1 to D5 of the divided photodiode element 100 and Xj represents the diffusion depth of the P-type buried diffusion regions 2 into the P-type semiconductor substrate 1 (see FIG. 1).

By setting the depth Xd of the depletion layer 21 expanding in the surface region of the substrate 1 upon the application of an inverse bias to the light-detecting sections D1 to D5 to be equal to or deeper than the diffusion depth Xj of the P-type buried diffusion regions 2 in this way, the diffusion movement distance of the detouring optical carriers can be shortened. As a result, the cutoff frequency characteristics in the state where a light beam has been irradiated onto an isolating section between adjacent light-detecting sections can be improved.

The specific resistance of the P-type semiconductor substrate 1 is set preferably in a range from about 30 Ωcm to about 1000 Ωcm, and more preferably in a range from about 50 Ωcm to about 500 Ωcm.

For example, by setting the specific resistance of the P-type semiconductor substrate 1 to be about 50 Ωcm, in the case where the diffusion depth Xj of the P-type buried diffusion regions 2 is about 2.5 μm and an inverse bias to be applied to the light-detecting sections is about 1.5 V, the depth Xd of the depletion layer 21 becomes about 3.2 μm and can be deeper than the diffusion depth Xj (=2.5 μm) of the P-type buried diffusion regions 2. The depth of the depletion layer 21 can be considerably increased in this way as shown in FIG. 1, so that the diffusion movement distance of the optical carriers in an isolating section between the light-detecting sections D2 and D3 can be shortened and the cutoff frequency in the isolating section can be increased.

Figure 11A:
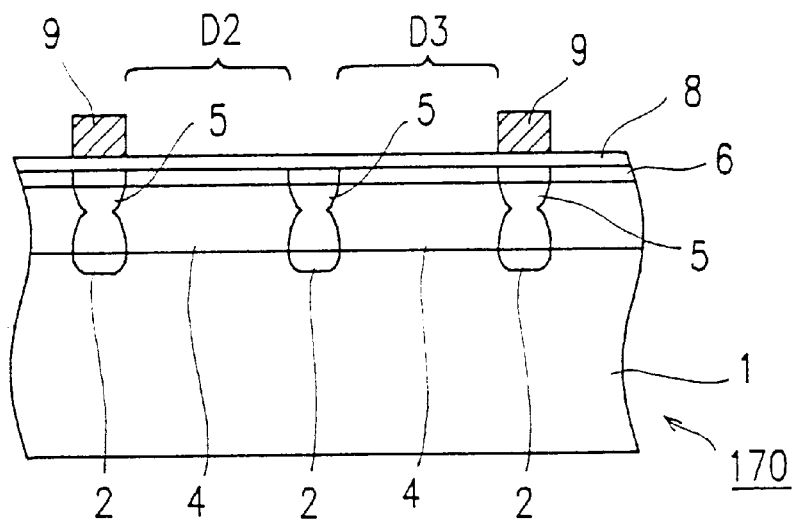
Figure 11B:
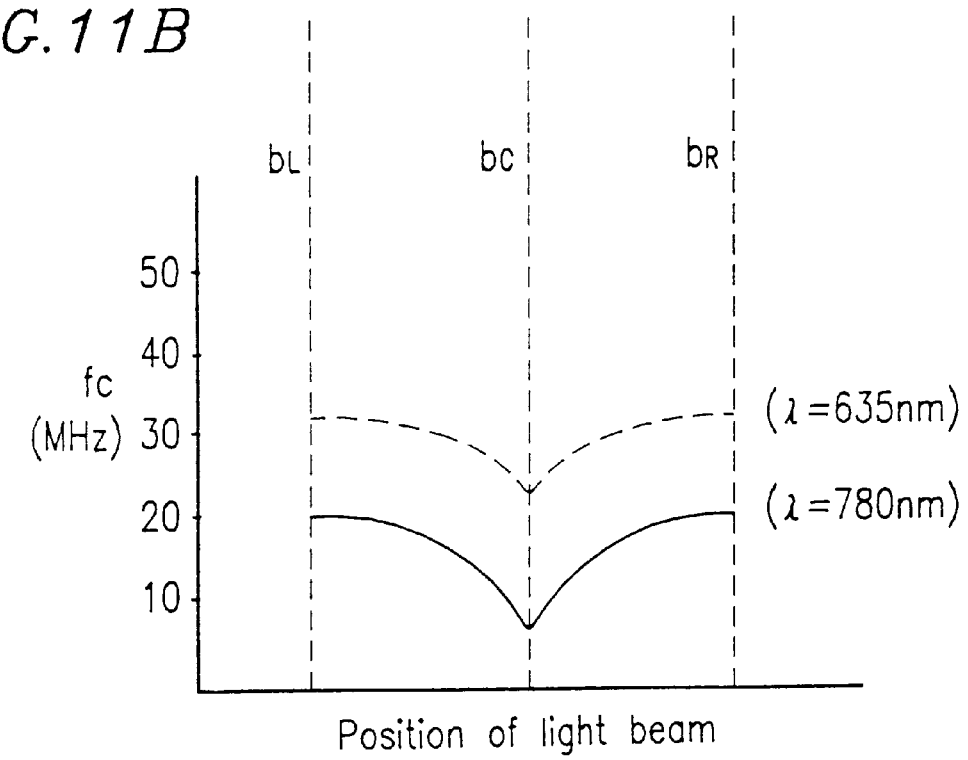
FIG. 11B is a graph representing the dependence of the cutoff frequency of the conventional light-receiving element shown in FIG. 9 upon the position of the light beam.
Figure 12:
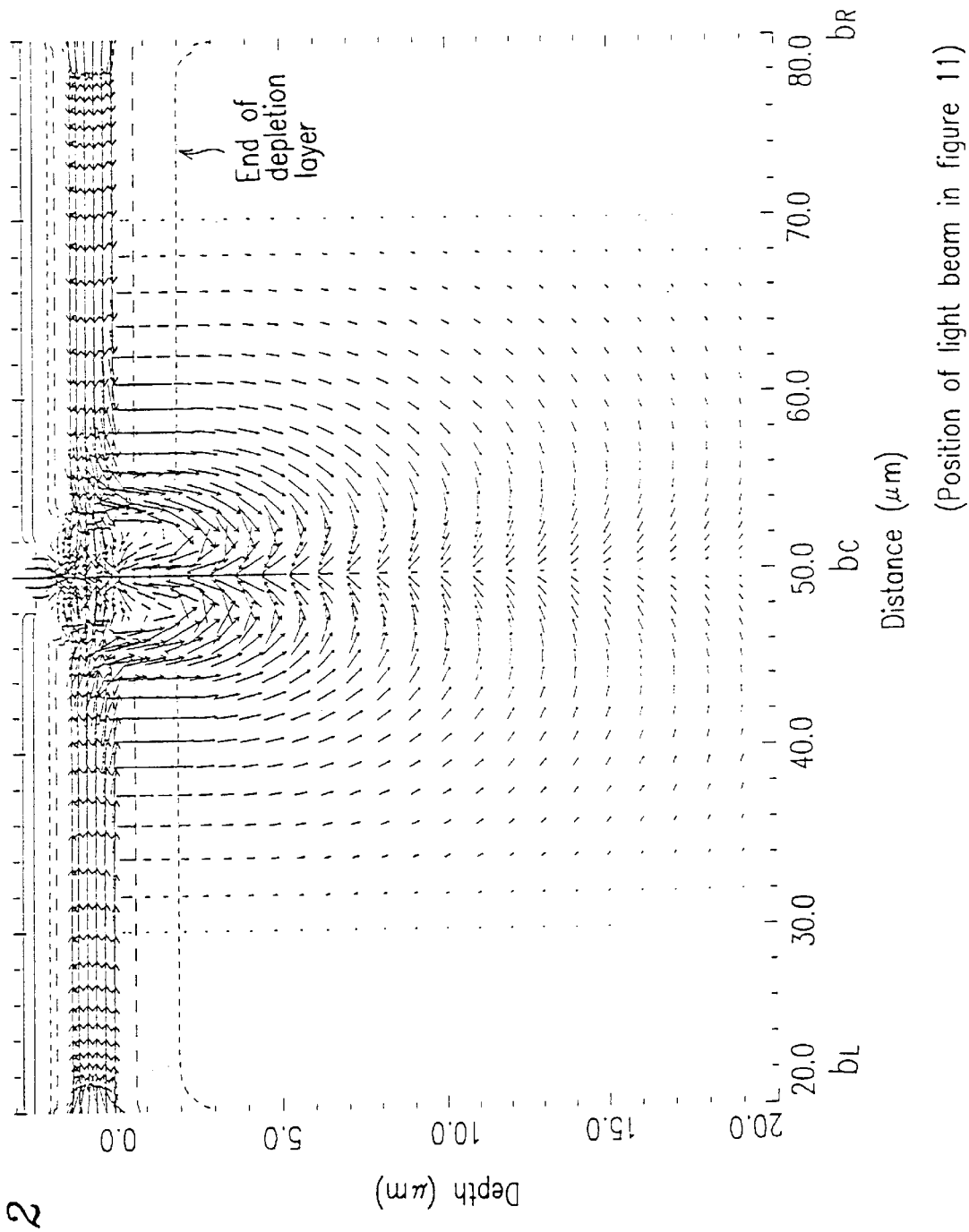
FIG. 12 is a diagram showing the results of the device simulation performed in the state where a light beam is irradiated onto the vicinity of an isolating section between adjacent light-detecting sections in the conventional light-receiving element shown in FIG. 9.
Figure 13:
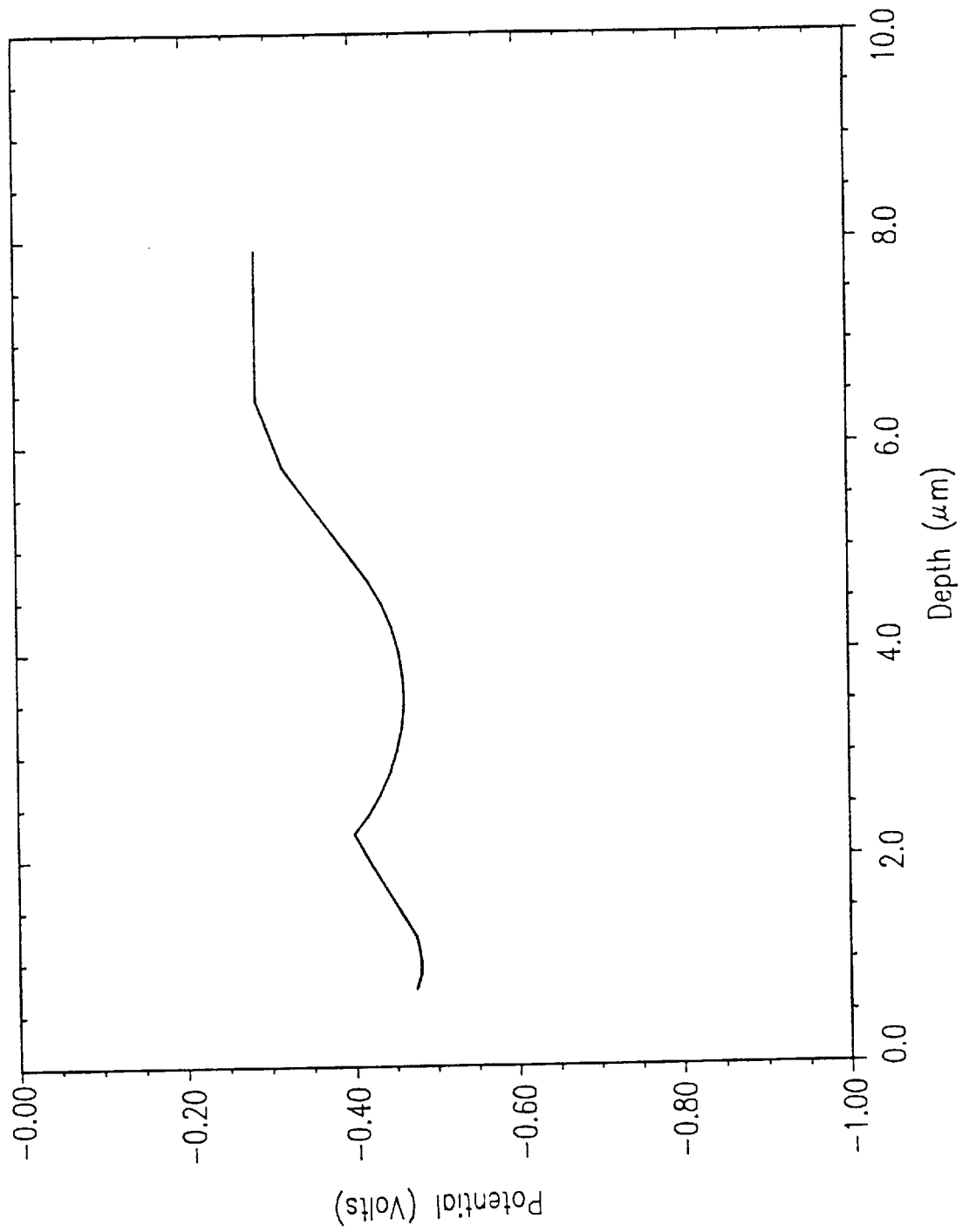
FIG. 13 is a graph showing the potential distribution in the vicinity of the isolating section between the light-detecting sections in the conventional light-receiving element shown in FIG. 9.
Figure 14A:
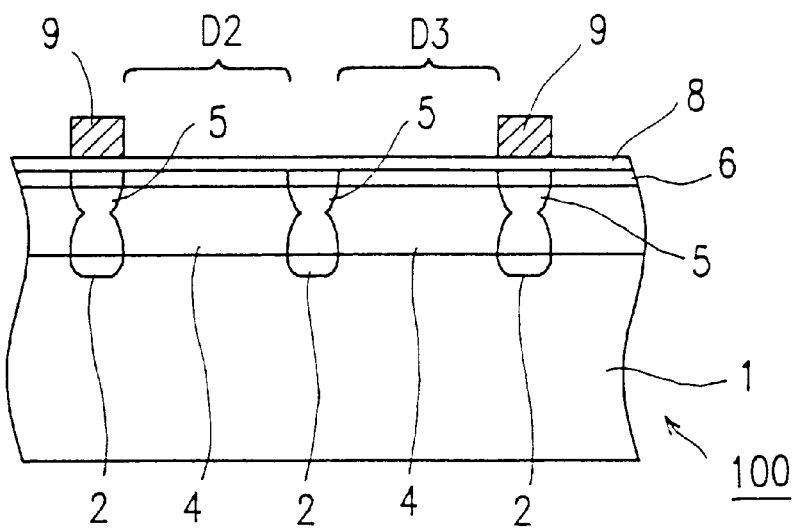
FIGS. 14A and 14B illustrate the response speed of the photodiode element in the first example when the specific resistance of the P-type semiconductor substrate is about 50 $\Omega$cm.
Figure 14B:
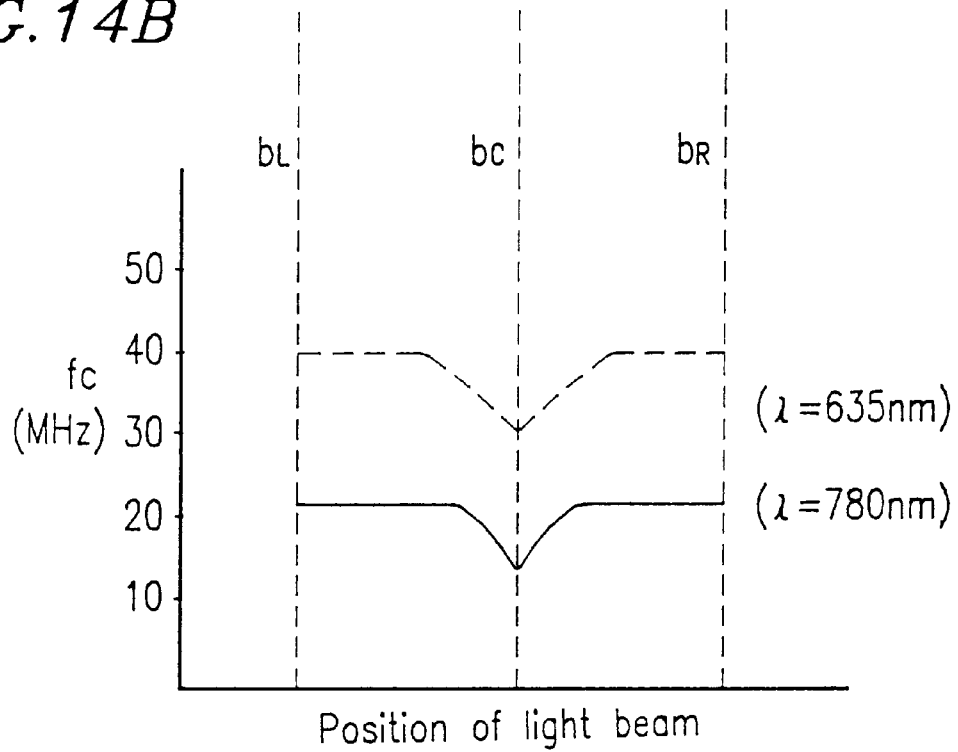

FIGS. 14A and 14B illustrate the response speed of the photodiode element 100 in the first example when the specific resistance of the P-type semiconductor substrate 1 is about 50 Ωcm. FIG. 14A is a view showing a cross-sectional structure in the vicinity of the light-detecting sections D2 and D3 of the divided photodiode element 100 shown in FIG. 1. On the other hand, FIG. 14B is a graph representing the dependence of the cutoff frequency of the divided photodiode element 100 upon the position of the light beam. In FIG. 14B, the abscissa represents the position of the light beam of the diffracted light in the vicinity of the light-detecting sections D2 and D3, while the ordinate represents the cutoff frequency fc (MHz) corresponding to the respective positions of the light beam. The same measurement method and conditions as those used for the conventional divided photodiode element 170 described with reference to FIG. 11A and 11B are used herein.

As shown in FIG. 14B, since the response speed in the isolating section of the divided photodiode element 100 is about 14 MHz with respect to light having a wavelength of 780 nm, it is possible to secure a high performance for the photodiode element such that the element is operable with an optical disk device for a 6× to 8× CD-ROM.

On the other hand, since the response speed in the isolating section of the element is as high as about 30 MHz with respect to light having a wavelength of 635 nm, the photodiode element can satisfy the performance required for a 2× DVD.

Therefore, by setting the specific resistance of the substrate in a range in which a relationship Xd ≥ Xj is satisfied, a photodiode element usable for a 6× to 8× CD-ROM and a 2× DVD can be provided.

As described above, as the specific resistance of the substrate becomes higher, the depletion layer 21 can be expanded to a larger degree and the movement distance of the optical carriers can be further shortened, so that a higher response speed is realized for a photodiode element. The depth of the depletion layer 21 can be in the range from about 3 μm to about 40 μm.

In the case of setting the specific resistance of the semiconductor substrate 1 in a range from about 30 Ωcm to about 1000 Ωcm, the following crystal growth methods are used in accordance with the target values of the specific resistance. For example, when the target value of the specific resistance is equal to or lower than 100 Ωcm, a crystal growth method such as a Czochralski (CZ) method is used; when the target value of the specific resistance is higher than 100 Ωcm and lower than 1000 Ωcm, a crystal growth method such as a magnetic-field-applied Czochralski (MCZ) method is used; and when the target value of the specific resistance is equal to or higher than 1000 Ωcm, a crystal growth method such as a float zone purification (FZ) method is used.

EXAMPLE 2

Figure 2:
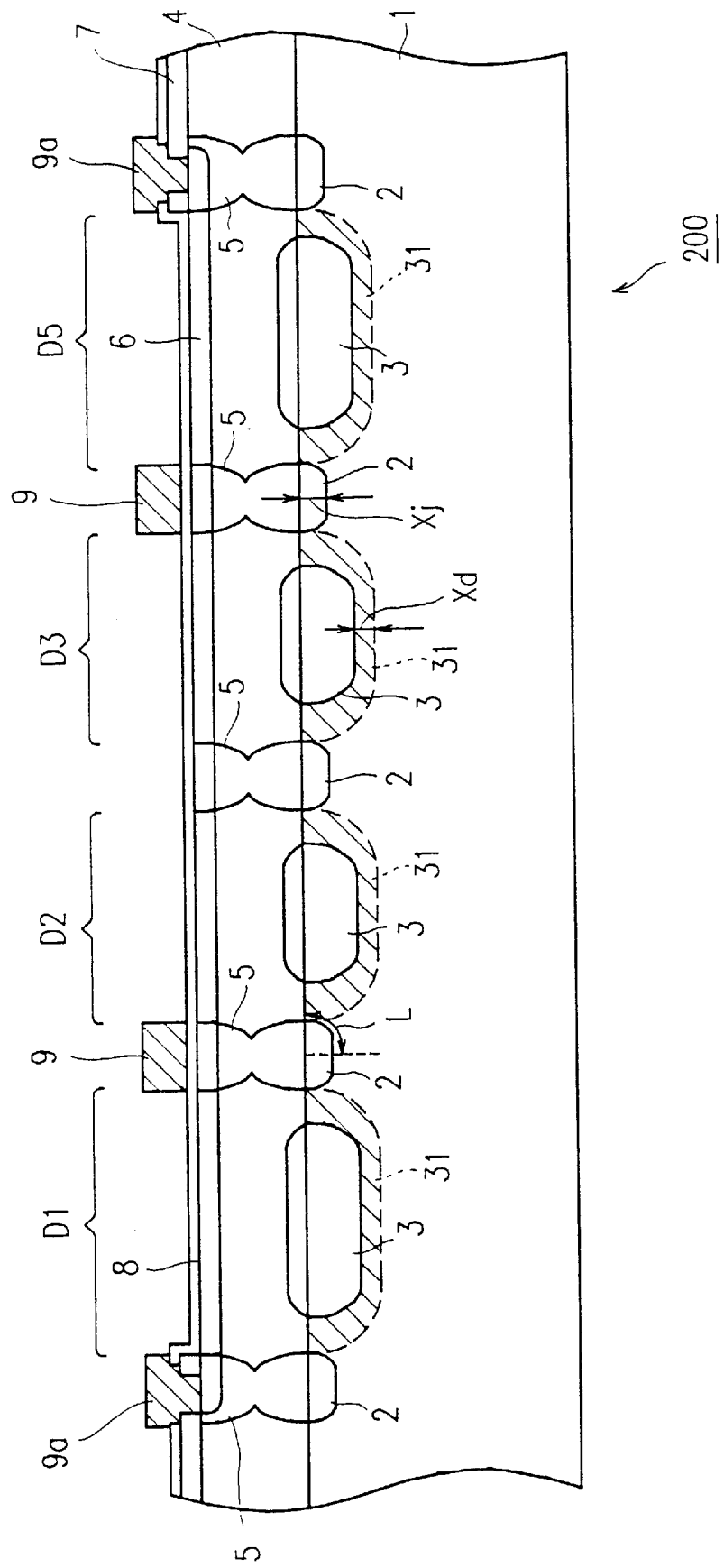
FIG. 2 is a cross-sectional view showing a structure of a light-receiving element in a second example of the present invention.

FIG. 2 shows a cross-sectional view of a divided photodiode element 200 in a second example of the present invention. It is noted that various components including a multi-layer wiring, a protective film and the like to be formed during the respective steps succeeding a metal wiring processing step are omitted in FIG. 2.

The fundamental structure of the divided photodiode element 200 is the same as that of the divided photodiode element 100 of the first example described with reference to FIG. 1. The divided photodiode element 200 is different from the divided photodiode element 100 in that N-type buried diffusion regions 3 are formed to be buried in the portions of the semiconductor substrate 1 so as to correspond to the light-detecting sections D1 to D5 (see Japanese Patent Application No. 6-162412). In this example, each of the N-type buried diffusion regions 3 is formed such that the N-type buried diffusion region 3 is distant from an adjacent P-type buried diffusion region 2 by a distance shorter than the detour distance L from each point on the outer circumference of the P-type buried diffusion region 2 to the N-type epi-layer 4.

Hereinafter, a method for fabricating the divided photodiode element 200 will be described with reference to the cross-sectional views illustrated as FIGS. 3A to 3D.

Figure 3A:
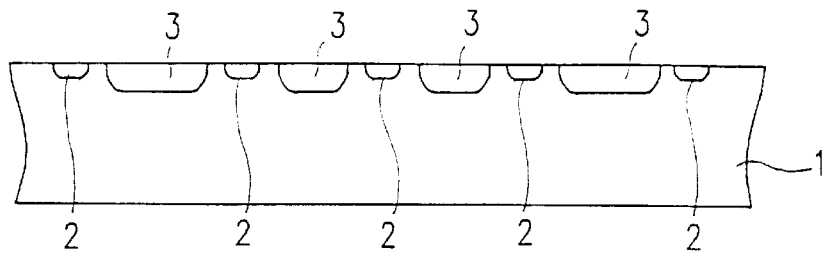
FIGS. 3A to 3D are cross-sectional views showing the respective process steps for fabricating the light-receiving element shown in FIG. 2.

First, as shown in FIG. 3A, a plurality of N-type buried diffusion regions 3 having a high impurity concentration (impurity concentration: $1 \times 10^{19}$ atoms/cm$^3$) are formed in a part of the surface region of the P-type semiconductor substrate (e.g., a silicon substrate) 1 to be the light-detecting sections. The thickness of the N-type buried diffusion regions 3 is in the range of about 3 μm to about 6 μm. In addition, a plurality of P-type buried diffusion regions 2 are formed in the regions to be the isolating sections for isolating the light-detecting sections from each other.

Figure 3B:
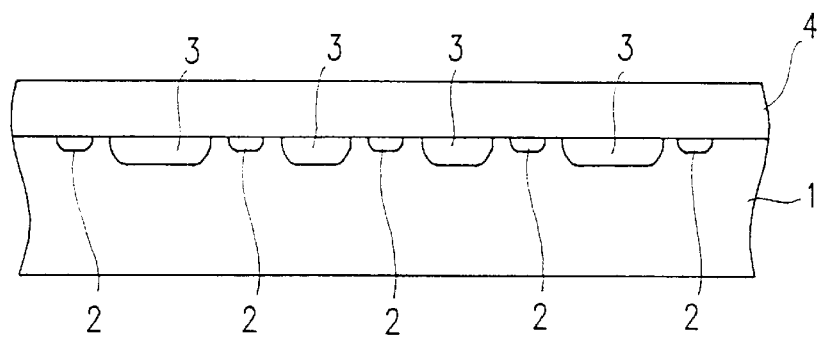

Next, as shown in FIG. 3B, an N-type epi-layer 4 is formed over the entire surface of the P-type semiconductor substrate 1. Then, P-type isolating diffusion regions 5 are formed in the respective regions inside the N-type epi-layer 4 so as to correspond to the P-type buried diffusion regions 2. The P-type isolating diffusion regions 5 are formed so as to vertically extend from the surface of the N-type epi-layer 4. As a result, a plurality of electrically isolated light-detecting sections D1 to D5 are formed as shown in FIG. 3C (though the light-detecting section D4 is not shown in FIG. 3C).

Figure 3C:
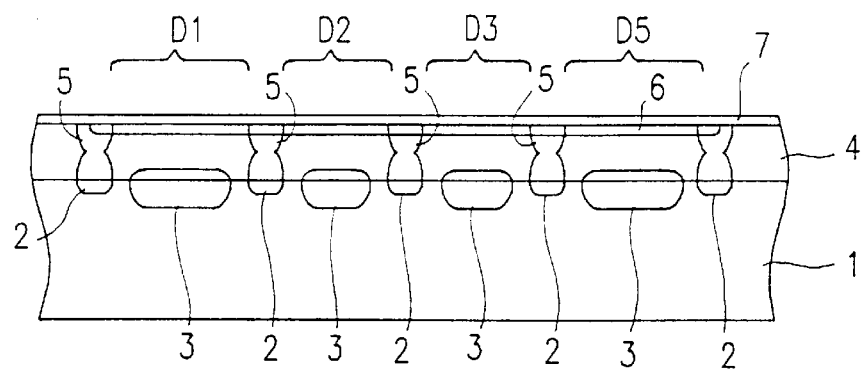

Then, as shown in FIG. 3C, a P-type diffusion layer 6 is formed in the surface region of the N-type epi-layer 4 between the P-type isolating diffusion region 5 on the right end and the P-type isolating diffusion region 5 on the left end so as to cover the upper surfaces of the P-type isolating diffusion regions 5 to be the isolating sections of the light-detecting sections D1 to D5.

Figure 3D:
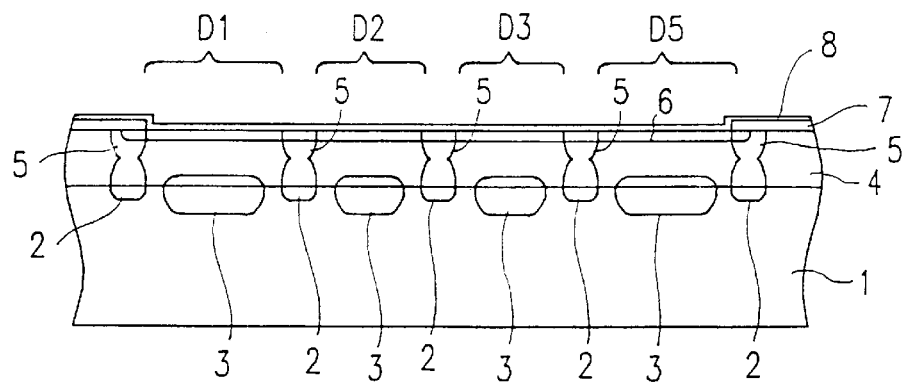

Subsequently, as shown in FIG. 3D, the portion of an oxide film 7 which is formed on the surface of the P-type diffusion layer 6 and the N-type epi-layer 4 when the P-type diffusion layer 6 is formed and which corresponds to the light-receiving region on the surface of the P-type diffusion layer 6 is removed, and a nitride film 8 is formed thereon instead above the semiconductor substrate 1. The film thickness of the nitride film 8 is set in accordance with the wavelength of the laser diode so as to function as an antireflection film.

Thereafter, electrode windows are opened through the oxide film 7 and the nitride film 8. Then, electrode wirings 9a are formed, and simultaneously, metal films 9 are formed on the surface of the nitride film 8 onto which the signal light is not irradiated, whereby the structure shown in FIG. 2 for the divided photodiode element 200 is obtained. A signal processor section (not shown) is formed on the semiconductor substrate 1 by performing an ordinary bipolar IC process.

By forming a plurality of N-type buried diffusion regions 3 having a high impurity concentration in the divided photodiode element 200 in the above-described manner, the serial resistance on the cathode side is reduced. Thus, a CR time constant resulting from the serial resistance and the capacitance of the photodiode element is reduced, so that the cutoff frequency characteristics are improved.

Figure 4A:
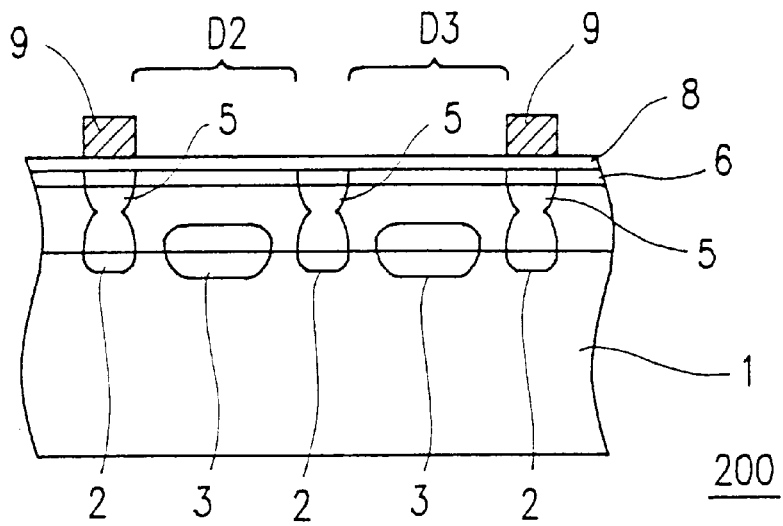
Figure 4B:
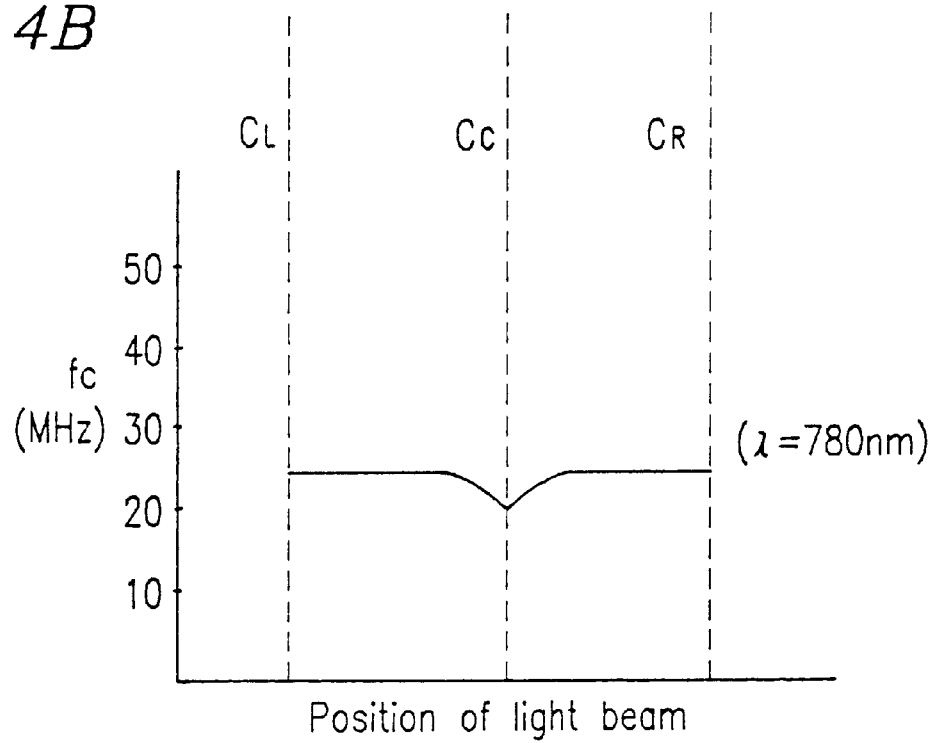
FIG. 4B is a graph representing the dependence of the cutoff frequency of the light-receiving element shown in FIG. 2 upon the position of the light beam.

FIG. 4A is a cross-sectional view showing the vicinity of the light-detecting sections D2 and D3 of the divided photodiode element 200 shown in FIG. 2. On the other hand, FIG. 4B is a graph representing the dependence of the cutoff frequency of the divided photodiode element 200 upon the position of the light beam. In FIG. 4B, the abscissa represents the position of the light beam of the diffracted light in the vicinity of the light-detecting sections D2 and D3, while the ordinate represents the cutoff frequency fc (MHz) at the respective positions. As shown in FIG. 4B, when the light beam is located in the vicinity of the isolating section between the light-detecting sections D2 and D3, the cutoff frequency fc is clearly decreased to a certain degree. However, the amount of the decrease is much smaller as compared with the conventional case as described with reference to FIG. 11B.

In this case, the specific resistance of the P-type semiconductor substrate 1 is about 15 Ωcm and the measurement conditions are the same as those used in FIG. 11A and 11B.

The divided photodiode element 200 shown in FIG. 2 realizes a response speed corresponding to an cutoff frequency of about 20 MHz in the isolating sections thereof and is operable with a CD-ROM having a 8× or lower response speed.

Figure 5:
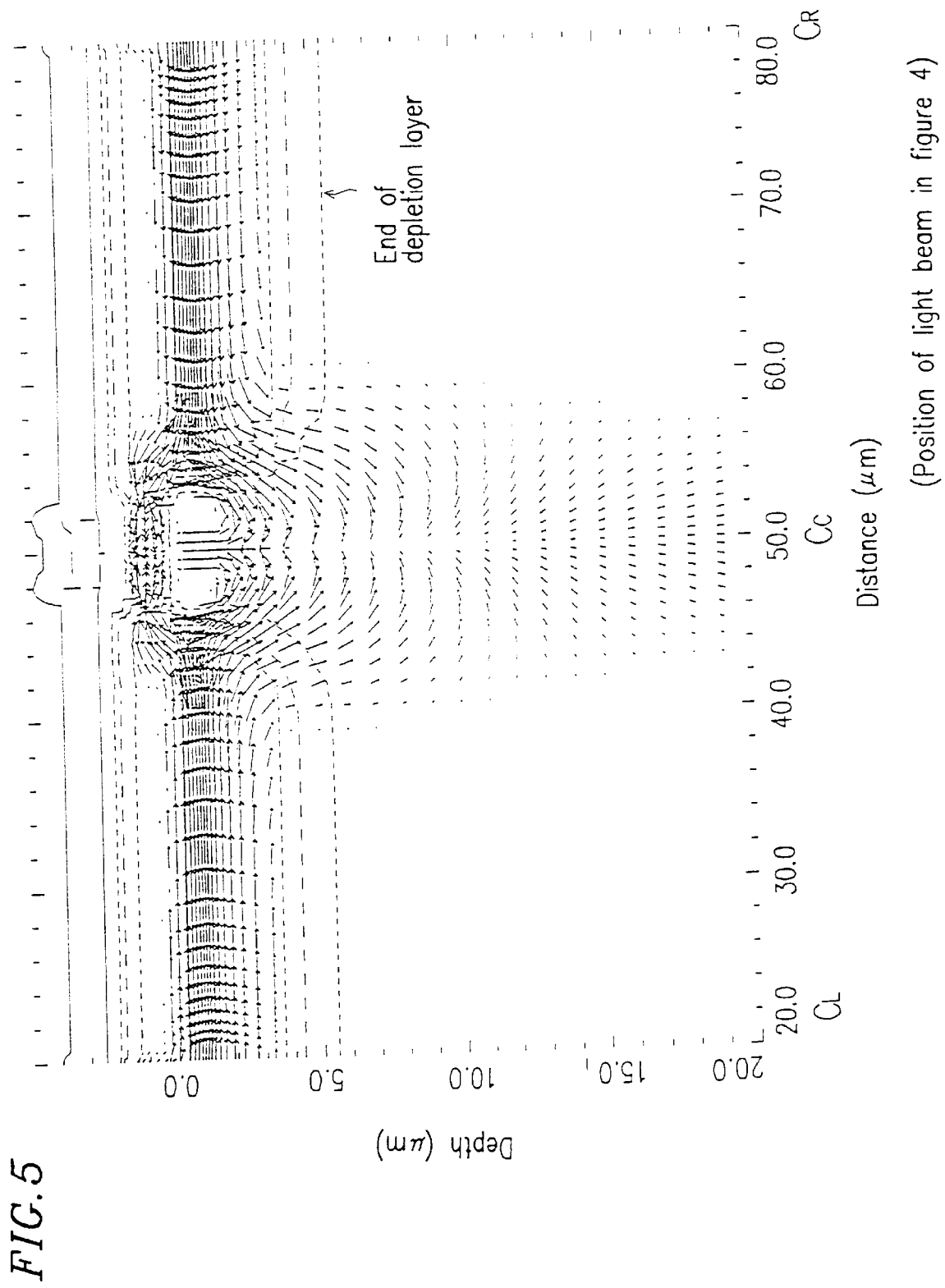
FIG. 5 is a diagram showing the results of the device simulation performed in the state where a light beam is irradiated onto the vicinity of an isolating section between light-detecting sections in the light-receiving element shown in FIG. 2.

FIG. 5 shows the results of the simulation for simulating the movement of the optical carriers in the divided photodiode element 200 shown in FIG. 2. In FIG. 5, the directions of the flowing currents are indicated by arrows. The electrons functioning as optical carriers move in the opposite directions to those indicated by the arrows shown in FIG. 5.

As described above, in the divided photodiode element 200, each of the N-type buried diffusion regions 3 is formed such that the N-type buried diffusion region 3 is distant from an adjacent P-type buried diffusion region 2 by a distance shorter than the detour distance from each point on the outer circumference of the P-type buried diffusion region 2 to the N-type epi-layer 4. Thus, upon the application of an inverse bias, a depletion layer 31 (the depth thereof is assumed to be denoted by Xd) is formed in the vertical direction from the lower end of the N-type buried diffusion regions 3 toward the substrate 1 (see FIG. 2). As a result, the diffusion movement distance of the optical carriers when a light beam is irradiated onto an isolating section between adjacent light-detecting sections can be shortened from 10-odd μm to several μm, so that the cutoff frequency can be increased. The cutoff frequency is further increased because of the reduction of the CR time constant.

However, as is seen from the simulation results shown in FIG. 5, the detour distance of the optical carriers around the P-type buried diffusion region 2 is still several μm in the structure shown in FIG. 2. Therefore, the response frequency when a light beam is irradiated onto an isolating section between light-detecting sections is still to be improved.

Figure 6:
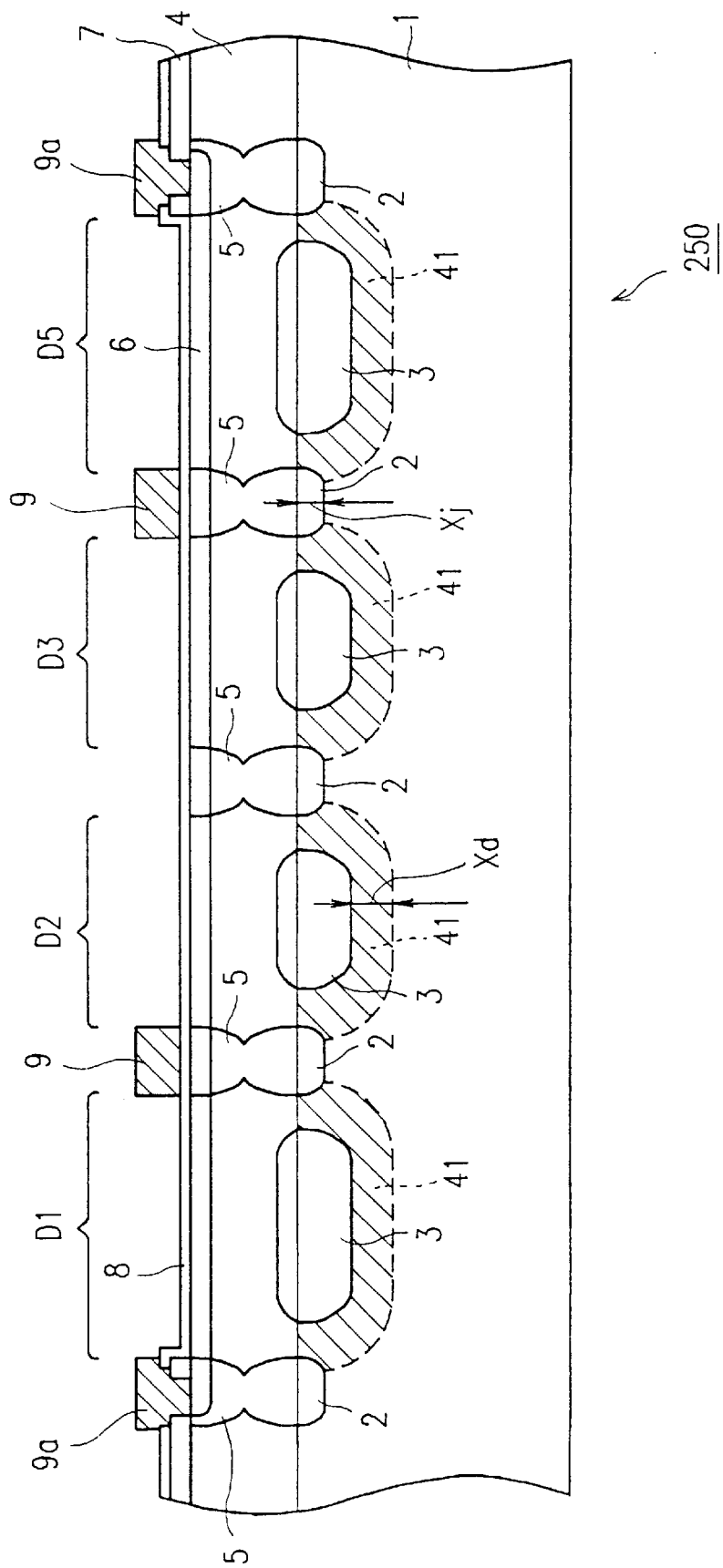
FIG. 6 is a cross-sectional view showing a structure for the light-receiving element in the second example of the present invention.
Figure 7:
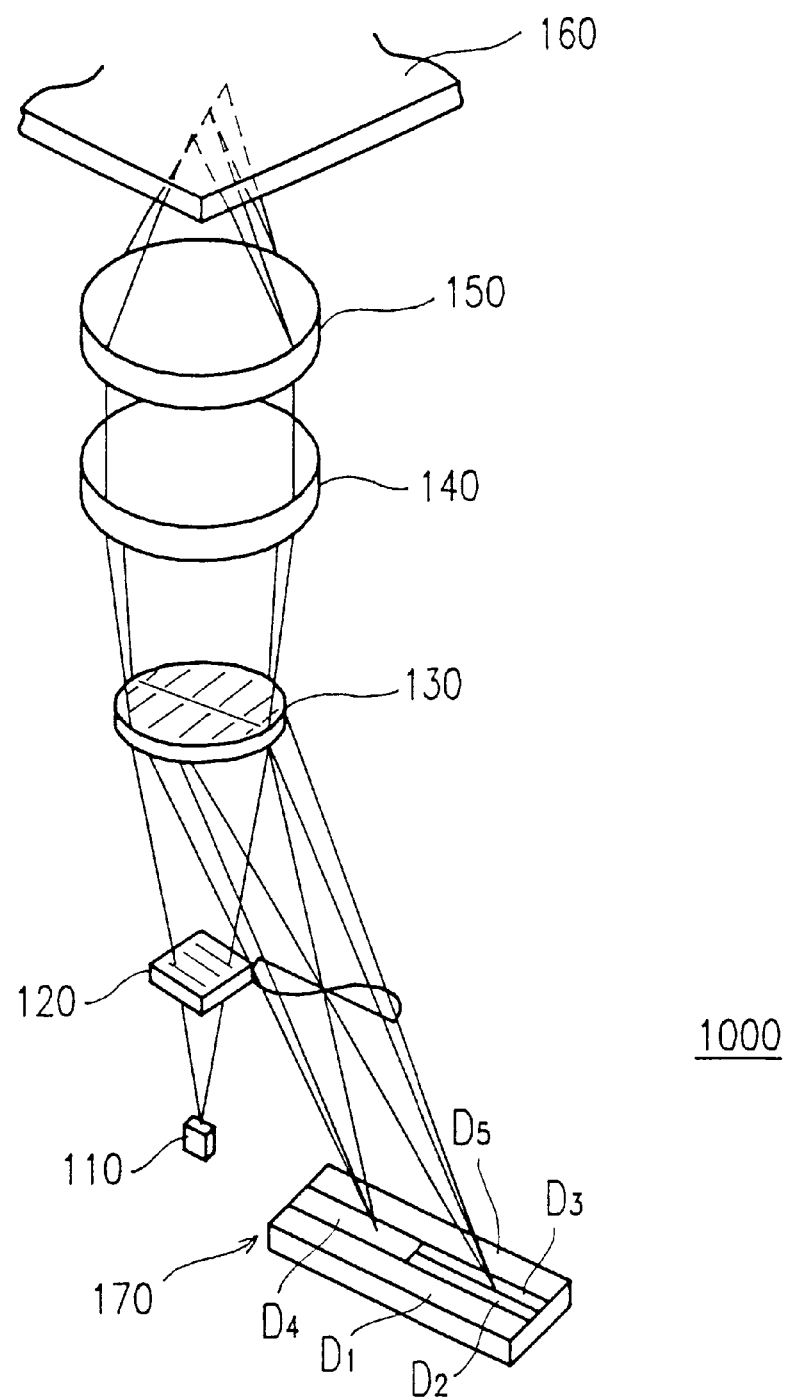
FIG. 7 is a perspective view showing an arrangement for an optical system for optical pickup using a hologram element.
Figure 8:
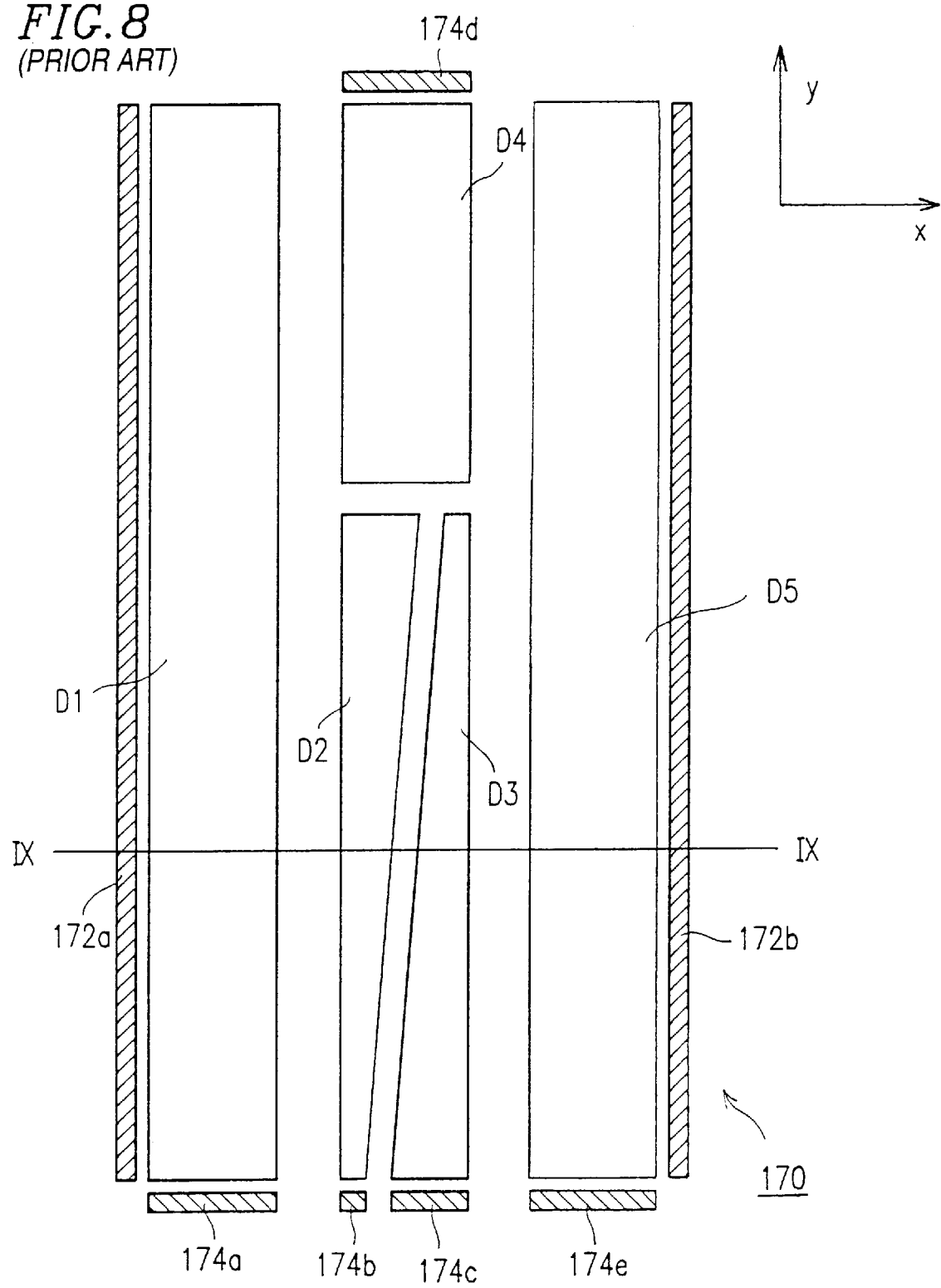
FIG. 8 is a plan view of a conventional light-receiving element used for the optical system for optical pickup shown in FIG. 7.
Figure 9:
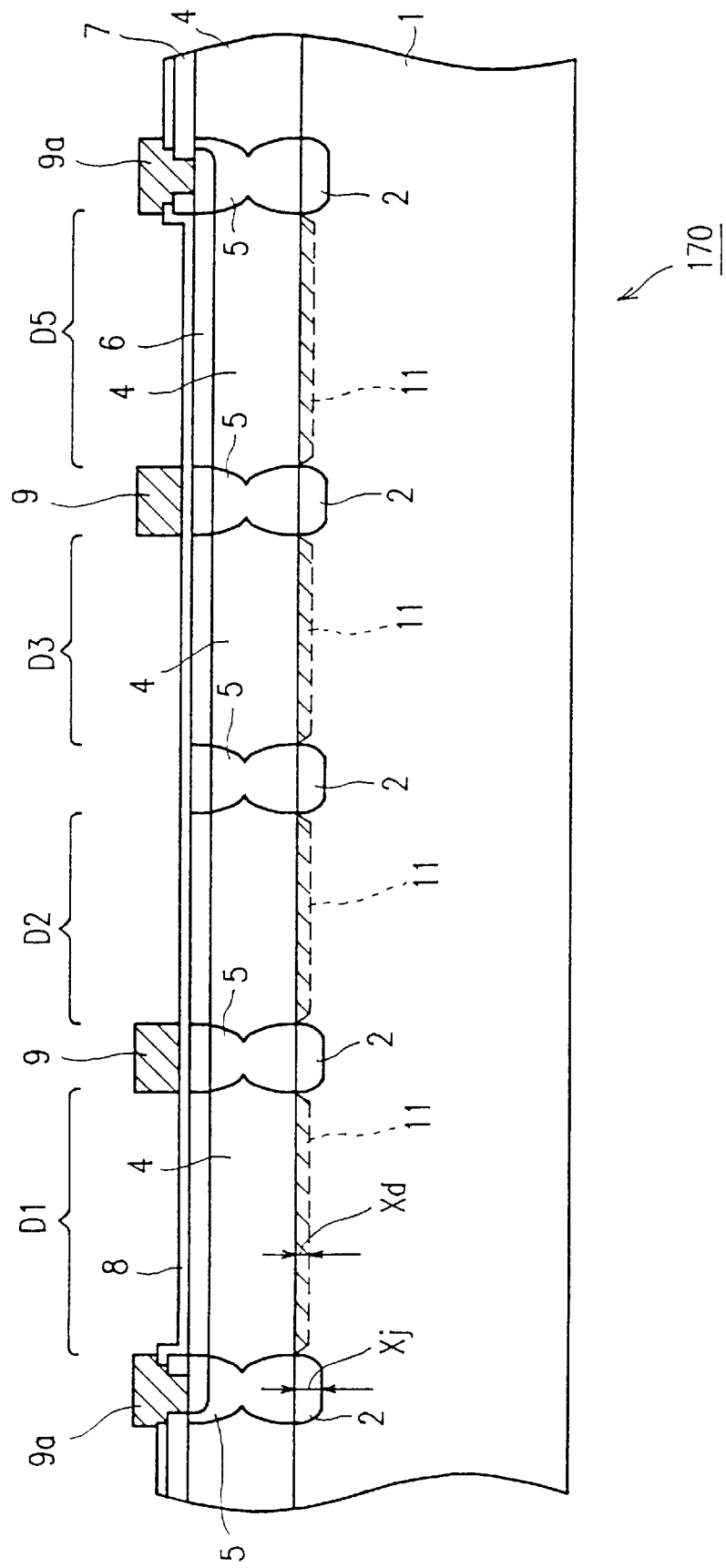
FIG. 9 is a cross-sectional view of the light-receiving element shown in FIG. 8 as seen along the line IX—IX.
Figure 10A:
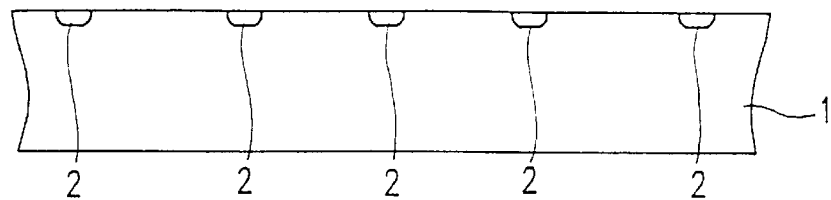
FIGS. 10A to 10D are cross-sectional views showing the respective process steps for fabricating the conventional light-receiving element shown in FIG. 9.
Figure 10B:
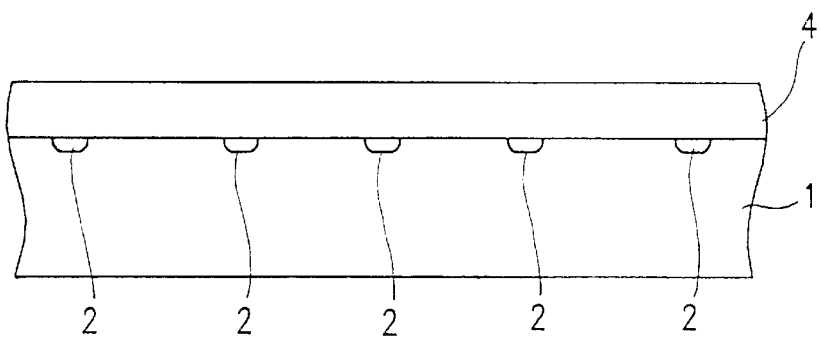
Figure 10C:
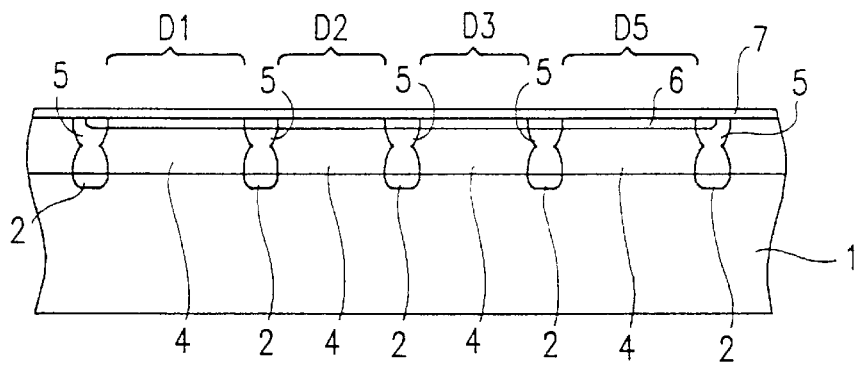
Figure 10D:
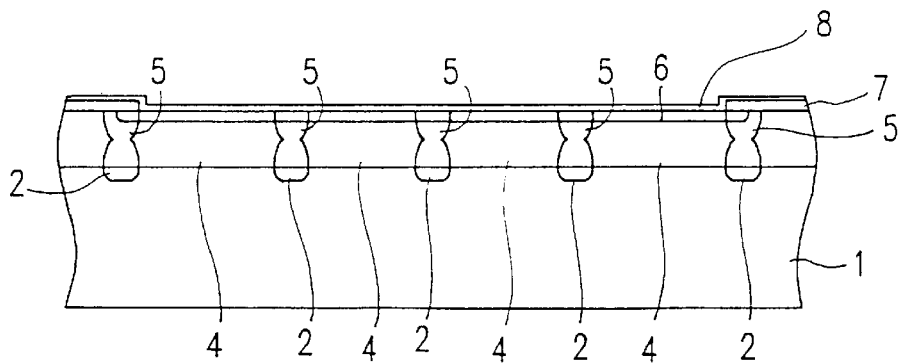

Thus, by setting the specific resistance of the P-type semiconductor substrate 1 so as to satisfy the following relationship in the same way as in the first example, a divided photodiode element 250 having a structure shown in FIG. 6 is obtained when the divided photodiode element 200 is configured so as to have a structure shown in FIG. 2.

$$Xd \geq Xj$$

where Xd represents the depth of the depletion layer 41 expanding in the surface region of the substrate 1 upon the application of an inverse bias to the light-detecting sections D1 to D5 of the divided photodiode element 250 and Xj represents the diffusion depth of the P-type buried diffusion regions 2 into the P-type semiconductor substrate 1 (see FIG. 6). The difference between the structure shown in FIG. 2 and the structure shown in FIG. 6 is that in the structure shown in FIG. 6 the above relationship (Xd≧Xj) is satisfied.

By setting the depth Xd of the depletion layer 41 expanding in the surface region of the substrate 1 upon the application of an inverse bias to the light-detecting sections to be equal to or deeper than the diffusion depth Xj of the P-type buried diffusion regions 2 in this way, the diffusion movement distance of the detouring optical carriers can be shortened, so that the cutoff frequency characteristics in the state where a light beam has been irradiated onto an isolating section between light-detecting sections can be improved.

The specific resistance of the P-type semiconductor substrate 1 is set preferably in a range from about 30 Ωcm to about 1000 Ωcm, more preferably in a range from about 50 Ωcm to about 500 Ωcm.

For example, by setting the specific resistance of the P-type semiconductor substrate 1 to be about 50 Ωcm, in the case where the diffusion depth Xj of the P-type buried diffusion regions 2 is about 2.5 μm and an inverse bias to be applied to the light-detecting sections is about 1.5 V, the depth Xd of the depletion layer 41 becomes about 3.2 μm and can be deeper than the diffusion depth Xj (=2.5 μm) of the P-type buried diffusion regions 2. The depletion layer 41 can be considerably enlarged in this way as shown in FIG. 6, so that the diffusion movement distance of the optical carriers in an isolating section between the light-detecting sections D2 and D3 can be shortened and the cutoff frequency in the isolating section can be increased.

Figure 15A:
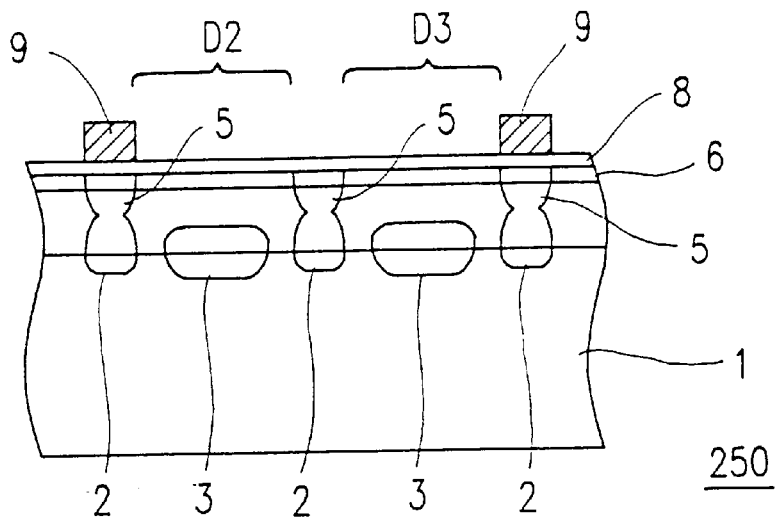
FIGS. 15A and 15B illustrate the response speed of the photodiode element in the second example when the specific resistance of the P-type semiconductor substrate is about 50 $\Omega$cm.
Figure 15B:
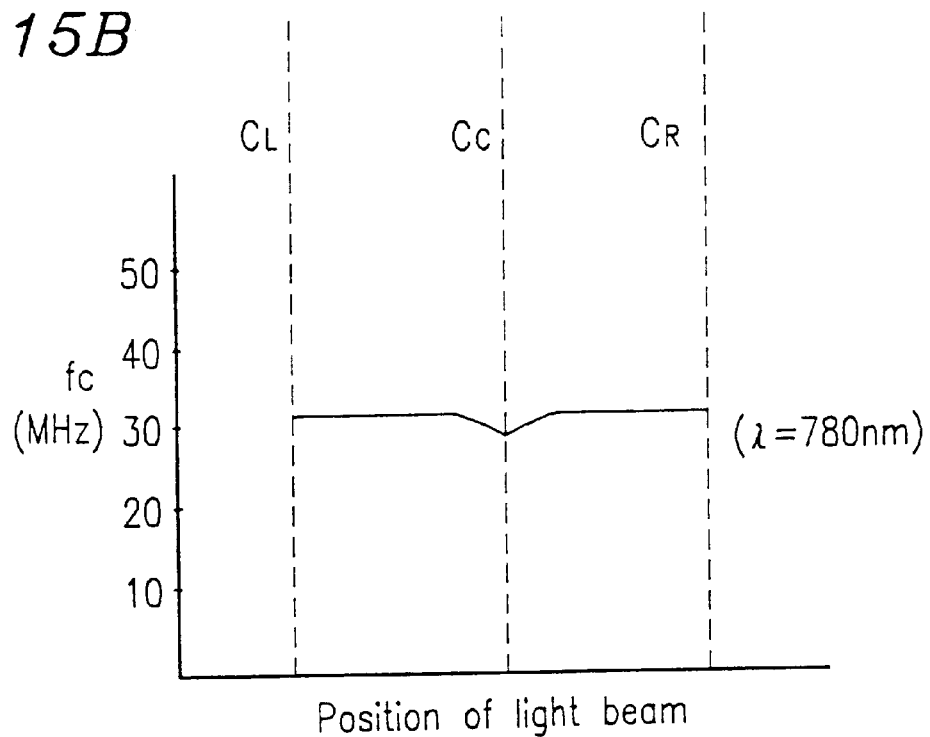

FIGS. 15A and 15B illustrate the response speed of the divided photodiode element 250 (see FIG. 6) in the second example when the specific resistance of the P-type semiconductor substrate 1 is about 50 Ωcm: FIG. 15A is a view showing a cross-sectional structure in the vicinity of the light-detecting sections D2 and D3 of the divided photodiode element 250 shown in FIG. 6, while FIG. 15B is a graph representing the dependence of the cutoff frequency of the divided photodiode element 250 upon the position of the light beam. In FIG. 15B, the abscissa represents the position of the light beam of the diffracted light in the vicinity of the light-detecting sections D2 and D3, while the ordinate represents the cutoff frequency fc (MHz) corresponding to the respective positions of the light beam. In this case, the measurement method and conditions, etc. are the same as those used for the conventional photodiode element described with reference to FIG. 11A and 11B.

A response speed corresponding to a cutoff frequency of about 30 MHz is realized in the isolating section of the element with respect to the light having a wavelength of 780 nm, so that this photodiode element can satisfy the response characteristics required for a photodiode element to be used for a 12× CD-ROM.

In this way, by configuring a photodiode element such that an N-type buried diffusion region is formed in the vicinity of an isolating section between light-detecting sections and such that the specific resistance of the substrate is set in a range so that a relationship Xd≧Xj is satisfied according to the present invention, a photodiode element usable for a 12× CD-ROM can be provided.

In the case of setting the specific resistance of the semiconductor substrate 1 in the range from about 30 Ωcm to about 1000 Ωcm, the same crystal growth methods as those mentioned in the first example can be used in accordance with the target values of the specific resistance. For example, when the target value of the specific resistance is equal to or lower than 100 Ωcm, a crystal growth method such as a Czochralski (CZ) method can be used; when the target value of the specific resistance is higher than 100 Ωcm and lower than 1000 Ωcm, a crystal growth method such as a magnetic-field-applied Czochralski (MCZ) method can be used; and when the target value of the specific resistance is equal to or higher than 1000 Ωcm, a crystal growth method such as a float zone purification (FZ) method can be used.

EXAMPLE 3

Figure 16:
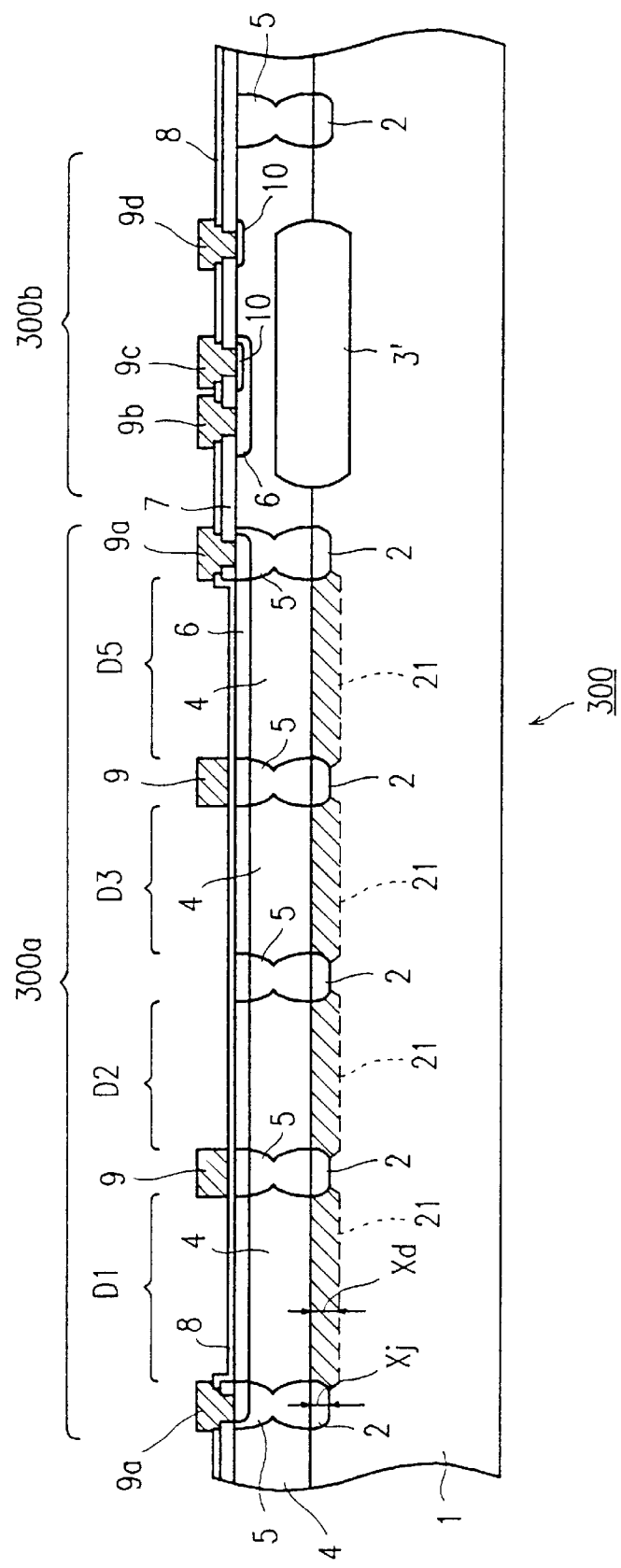
FIG. 16 is a cross-sectional view showing, as a light-receiving element in a third example of the present invention, an IC type light-receiving element 300 in which not only a divided photodiode element but also a signal processor are mounted on the same substrate.

FIG. 16 is a cross-sectional view showing, as a light-receiving element in a third example of the present invention, an IC type light-receiving element 300 in which not only a divided photodiode element but also a signal processor are mounted on the same substrate. In FIG. 16, various components including a multi-layer wiring, a protective film and the like to be formed during the respective steps succeeding a metal wiring processing step are omitted.

The fundamental structure of the divided photodiode element 300a in this IC type light-receiving element 300 is the same as that of the divided photodiode element 100 of the first example described with reference to FIG. 1. The third example is different from the first example in that a signal processor 300b is formed in a region, other than the region in which the divided photodiode element 300a is formed, of the N-type epi-layer 4.

Hereinafter, a method for fabricating the IC type light-receiving element 300 will be described with reference to FIG. 16. In this case, an n-p-n transistor is formed as the signal processor 300b.

First, an N-type buried diffusion region 3' for reducing the collector resistance is formed in a part of the region in which an n-p-n transistor is to be formed on the P-type semiconductor substrate 1. In addition, a plurality of P-type buried diffusion regions 2 are formed in the regions to be the isolating sections for isolating the light-detecting sections from each other and the regions for isolating the respective elements of the signal processor.

Next, an N-type epi-layer 4 is formed over the entire surface of the P-type semiconductor substrate 1. Then, P-type isolating diffusion regions 5 are formed in the respective regions inside the N-type epi-layer 4 so as to correspond to the P-type buried diffusion regions 2. The P-type isolating diffusion regions 5 are formed so as to vertically extend from the surface of the N-type epi-layer 4.

As a result, the respective light-detecting sections D1 to D5 (though D4 is not shown in FIG. 16) and the respective elements of the signal processor 300b are electrically isolated from each other.

Then, P-type diffusion layers 6 are formed in the surface region of the N-type epi-layer 4 between the P-type isolating diffusion region 5 on the right end and the P-type isolating diffusion region 5 on the left end in the divided photodiode element 300a so as to cover the upper surfaces of the P-type isolating diffusion regions 5 to be the isolating sections of the light-detecting sections D1 to D5 and in the region in which a base is to be formed for the signal processor 300b.

Subsequently, N-type diffusion regions 10 are formed in the region in which an emitter of the n-p-n transistor is to be formed and in the region in which a collector electrode is to be formed in the signal processor 300b.

Thereafter, the portion of an oxide film 7 which is formed on the surface of the P-type diffusion layer 6 and the N-type epi-layer 4 when the P-type diffusion layer 6 is formed and which corresponds to the light-receiving region on the surface of the P-type diffusion layer 6 is removed, and a nitride film 8 is formed thereon instead.

The film thickness of the nitride film 8 is set in accordance with the wavelength of the laser diode so as to function as an antireflection film. Next, electrode windows are opened through the oxide film 7 and the nitride film 8.

Then, electrode wirings 9a are formed, and simultaneously, metal films 9 are formed on the surface of the nitride film 8 onto which the signal light is not irradiated. Furthermore, a base electrode 9b, an emitter electrode 9c and a collector electrode 9d are simultaneously formed in the corresponding portions of the P-type diffusion layer 6 and the N-type diffusion region 10 in the signal processor 300b.

In this way, a structure shown in FIG. 16 for an IC type light-receiving element 300 in which the divided photodiode element 300a and the signal processor 300b are mounted on the same substrate is obtained.

Since the divided photodiode element of the third example is the same as that of the first example, a detailed description about the characteristics of the divided photodiode element will be omitted herein.

In this third example, an IC type light-receiving element, in which the response characteristics of the isolating sections in the divided photodiode element are improved in the same way as in the first example, can be obtained.

EXAMPLE 4

Figure 17:
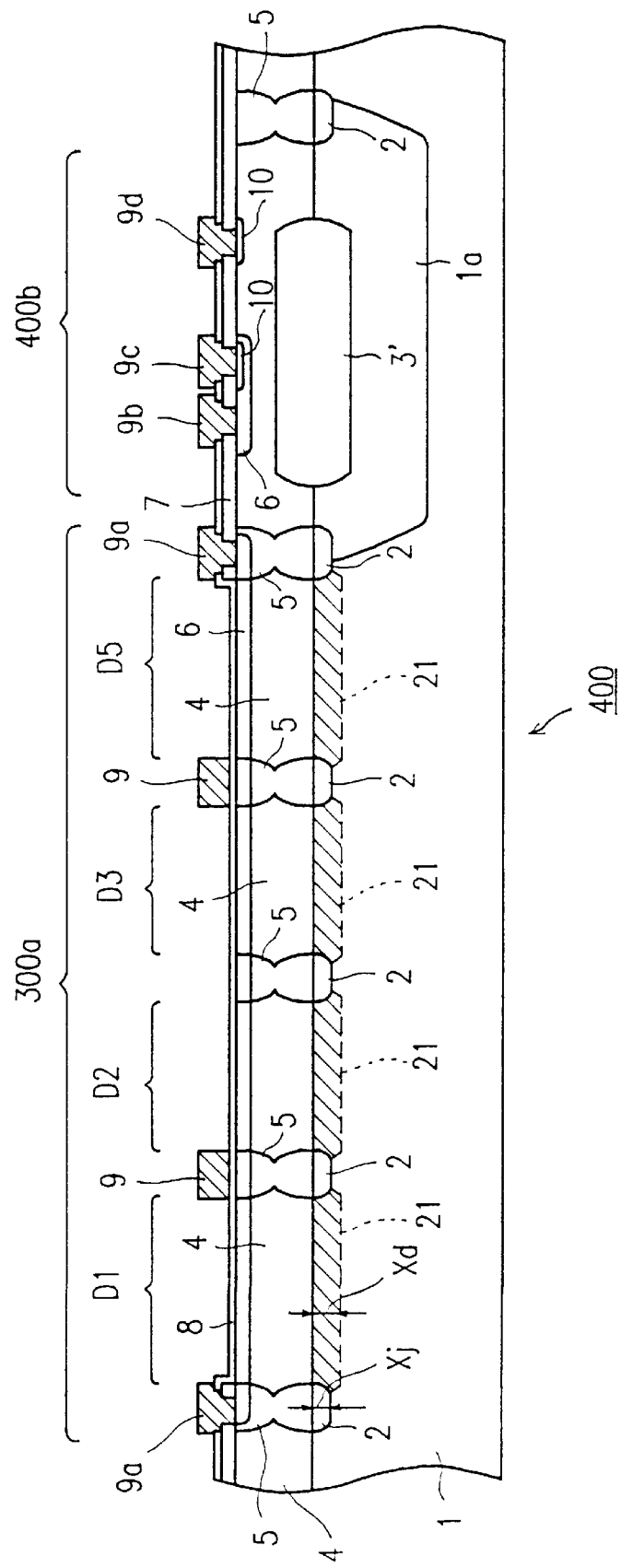
FIG. 17 is a cross-sectional view showing, as a light-receiving element in a fourth example of the present invention, an IC type light-receiving element 400 in which not only a divided photodiode element but also a signal processor are mounted on the same substrate.

FIG. 17 is a cross-sectional view showing, as a light-receiving element in a fourth example of the present invention, an IC type light-receiving element 400 in which not only a divided photodiode element but also a signal processor are mounted on the same substrate. In FIG. 17, various components including a multi-layer wiring, a protective film and the like to be formed during the respective steps succeeding a metal wiring processing step are omitted.

The fundamental structure of the divided photodiode element 300a in this IC type light-receiving element 400 is the same as that of the divided photodiode element 100 of the first example described with reference to FIG. 1. The fourth example is different from the first example in that a signal processor 400b is formed in a region, other than the region in which the divided photodiode element 300a is formed, on the N-type epi-layer 4.

A P-type buried diffusion region 1a, as well as the respective components of the signal processor 300b of the third example, is provided for the signal processor 400b. The P-type buried diffusion region 1a is formed in a part of the surface region of the P-type semiconductor substrate 1 corresponding to the signal processor section 400b. The thickness of the P-type buried diffusion region 1a is in the range of about 5 $\mu$m to about 10 $\mu$m.

The P-type buried diffusion region 1a is provided for preventing a latch up from being caused in the signal processor 400b and is optionally formed if it is necessary for increasing the specific resistance of the substrate.

In the third and the fourth examples, a divided photodiode element having the same structure as that of the divided photodiode element in the first example is used. Alternatively, a divided photodiode element having the same structure as that of the photodiode element 250 of the second example described with reference to FIG. 6 may be mounted together with the signal processor on the same substrate.

In the foregoing description, the present invention has been applied to a divided photodiode element to be used as a light-receiving element for receiving the light reflected by a disk in an optical pickup optical system. Alternatively, the present invention is applicable to a photodiode element in any other optical system or a photodiode element having a different shape.

It is noted that the present invention is applicable to configurations in which all of the conductivity types (i.e., the P-type and the N-type), employed in the foregoing description are inverted. In such a case, the same effects as the above-described effects can also be attained.

As is apparent from the foregoing description and according to the present invention, by increasing the specific resistance of a semiconductor substrate of a first conductivity type (e.g., P-type), the width (or the depth) of the depletion layer expanding in the light-detecting sections toward the substrate is set to be equal to or larger than the diffusion depth of the isolating sections of the light-detecting sections in the semiconductor substrate. As a result, the diffusion movement distance of the optical carriers making a detour around a semiconductor region of the first conductivity type (e.g., a P-type buried diffusion region) can be shortened, so that the response speed of the divided photodiode element is increased and the frequency characteristics thereof can be improved. According to the present invention, a photodiode element having a response speed of about 14 MHz or higher is realized with respect to light having a wavelength of 780 nm, while a photodiode element having a response speed of about 30 MHz or higher is realized with respect to light having a wavelength of 635 nm.

Furthermore, the present invention is also applicable to a structure in which a buried diffusion region of a second conductivity type (e.g., an N-type buried diffusion region) is formed to be buried in the surface region of the semiconductor substrate corresponding to a light-detecting section. In such a case, the diffusion movement distance of the optical carriers making a detour around a semiconductor layer of the first conductivity type (e.g., a P-type buried diffusion region) can be further shortened, so that the response speed and the frequency characteristics of the divided photodiode element can be considerably improved.

Various other modifications will be apparent to and can be readily made by those skilled in the art without departing from the scope and spirit of this invention. Accordingly, it is not intended that the scope of the claims appended hereto be limited to the description as set forth herein, but rather that the claims be broadly construed.

What is claimed is:

1. A light-receiving element which is a divided photodiode element including a plurality of light-detecting sections, the light receiving element comprising:

a semiconductor substrate of a first conductivity type;

a first semiconductor layer of a second conductivity type which is formed in a predetermined region in which the divided photodiode element is formed, on a surface of the semiconductor substrate of the first conductivity type; and at least one semiconductor region of the first conductivity type which is formed so as to extend from an upper surface of the first semiconductor layer of the second conductivity type into the surface of the semiconductor substrate of the first conductivity type, thereby dividing the first semiconductor layer of the second conductivity type into a plurality of semiconductor regions of the second conductivity type, wherein a specific resistance of the semiconductor substrate of the first conductivity type is set in a predetermined range such that a condition $Xd \geq Xj$ is satisfied between a depth Xd of a depletion layer to be formed at a junction between the semiconductor substrate of the first conductivity type and the first semiconductor layer of the second conductivity type upon an application of an inverse bias and a diffusion depth Xj of the semiconductor region of the first conductivity type into the semiconductor substrate of the first conductivity type, and wherein optical carriers generated upon irradiation of a light beam onto the semiconductor region of the first conductivity type move to a junction between the semiconductor substrate of the first conductivity type and the first semiconductor layer of the second conductivity type.

2. A light-receiving element according to claim 1, wherein a plurality of second semiconductor regions of the second conductivity type are buried in the semiconductor substrate of the first conductivity type so as to correspond to the plurality of divided semiconductor regions of the second conductivity type, respectively.

3. A light-receiving element according to claim 1, wherein a predetermined circuit element is formed in a region other than the predetermined region in which the divided photodiode element is formed, on the surface of the semiconductor substrate of the first conductivity type.

4. A light receiving element according to claim 2, wherein a predetermined circuit element is formed in a region other than the predetermined region in which the divided photodiode element is formed, on the surface of the semiconductor substrate of the first conductivity type.

5. A light-receiving element according to claim 3, wherein each of the light-detecting sections for detecting signal light is formed by each of the plurality of divided semiconductor regions of the second conductivity type and a region of the semiconductor substrate of the first conductivity type which corresponds to and underlies the semiconductor region of the second conductivity type.

6. A light-receiving element according to claim 1, wherein the specific resistance of the semiconductor substrate of the first conductivity type is in a range from about 30 Ωcm to about 1000 Ωcm.

7. A light-receiving element according to claim 1, having a response speed of about 14 MHz or higher.

8. A light-receiving element according to claim 1, having a response-speed of about 30 MHz or higher.

9. A light-receiving element according to claim 1, wherein the depth Xd of the depletion layer is in a range from about 3 μm to about 40 μm.

10. A light-receiving element according to claim 2, wherein the depletion layer is formed from a lower end of the buried second semiconductor region toward the semiconductor substrate.

11. An integrated circuit light-receiving element including a divided photodiode element which has a plurality of light-detecting sections, the divided photodiode element comprising:

a semiconductor substrate of a first conductivity type;

a first semiconductor layer of a second conductivity type which is formed in a predetermined region in which the divided photodiode element is formed, on a surface of the semiconductor substrate of the first conductivity type;

at least one semiconductor region of the first conductivity type which is formed so as to extend from an upper surface of the first semiconductor layer of the second conductivity type to the surface of the semiconductor substrate of the first conductivity type, thereby dividing the first semiconductor layer of the second conductivity type into a plurality of semiconductor regions of the second conductivity type, the semiconductor region of the first conductivity type having a diffusion depth Xj into the semiconductor substrate of the first conductivity type the depth Xj being measured from the surface of the semiconductor substrate; and a depletion layer formed at a junction between the semiconductor substrate of the first conductivity type and the first semiconductor layer of the second conductivity type upon an application of an inverse bias, the depletion layer having a depth Xd, wherein $Xd \geq Xj$, wherein optical carriers generated upon irradiation of a light beam onto the semiconductor region of the first conductivity type move to a junction between the semiconductor substrate of the first conductivity type and the first semiconductor layer of the second conductivity type.

12. An integrated circuit light-receiving element according to claim 11, wherein a plurality of second semiconductor regions of the second conductivity type are buried in the semiconductor substrate of the first conductivity type so as to correspond to the plurality of divided semiconductor regions of the second conductivity type, respectively.

13. An integrated circuit light-receiving element according to claim 12, wherein a predetermined circuit element is formed in a region other than the predetermined region in which the divided photodiode element is formed, on the surface of the semiconductor substrate of the first conductivity type.

14. An integrated circuit light-receiving element according to claim 12, wherein the depletion layer is formed from a lower end of the buried second semiconductor region toward the semiconductor substrate.

15. An integrated circuit light-receiving element according to claim 11, wherein a predetermined circuit element is formed in a region other than the predetermined region in which the divided photodiode element is formed, on the surface of the semiconductor substrate of the first conductivity type.

16. An integrated circuit light-receiving element according to claim 15, wherein each of the light-detecting sections for detecting signal light is formed by each of the plurality of divided semiconductor regions of the second conductivity type and a region of the semiconductor substrate of the first conductivity type which corresponds to and underlies the semiconductor region of the second conductivity type.

17. An integrated circuit light-receiving element according to claim 11, wherein the specific resistance of the semiconductor substrate of the first conductivity type is in a range from about 30 Ωcm to about 1000 Ωcm.

18. An integrated circuit light-receiving element according to claim 11, having a response speed of about 14 MHz or higher.

19. An integrated circuit light-receiving element according to claim 11, having a response speed of about 30 MHz or higher.

20. An integrated circuit light-receiving element according to claim 11, wherein the depth Xd of the depletion layer is in a range from about 3 μm to about 40 μm.

21. A light-receiving element which is a divided photodiode element including a plurality of light-detecting sections, the light-receiving element comprising:

a semiconductor substrate of a first conductivity type;

a first semiconductor layer of a second conductivity type which is formed in a predetermined region in which the divided photodiode element is formed, on a surface of the semiconductor substrate; and at least one semiconductor diffusion region of the first conductivity type which is formed so as to extend from an upper surface of the first semiconductor layer into the surface of the semiconductor substrate, thereby dividing the first semiconductor layer into a plurality of semiconductor regions of the second conductivity type, wherein a light is incident onto the plurality of semiconductor regions of the second conductivity type, and onto the at least one semiconductor region of the first conductivity type, and wherein a specific resistance of the semiconductor substrate is set in a predetermined range such that a condition $Xd \geq Xj$ is satisfied between a depth $Xd$ of a depletion layer to be formed in all the semiconductor substrate surface on which the first semiconductor layer of the second conductivity type is formed, upon an application of an inverse bias, and a diffusion depth $Xj$ of the semiconductor region of the first conductivity type into the semiconductor substrate, and wherein optical carriers generated upon irradiation of a light beam onto the semiconductor region of the first conductivity type move to a junction between the semiconductor substrate of the first conductivity type and the first semiconductor layer of the second conductivity type.

22. A light-receiving element according to claim 1, wherein the condition $Xd \geq Xj$ is satisfied across the entire semiconductor substrate surface on which the first semiconductor layer of the second conductivity type is formed.

23. An integrated circuit light-receiving element according to claim 11, wherein the condition $Xd \geq Xj$ is satisfied across the entire semiconductor substrate surface on which the first semiconductor layer of the second conductivity type is formed.

24. A light receiving element according to claim 1, wherein the diffusion depth $Xj$ is 2.5 $\mu$m.

25. An integrated circuit light-receiving element according to claim 11, wherein the diffusion depth $Xj$ is 2.5 $\mu$m.

26. A light receiving element according to claim 21, wherein the diffusion depth $Xj$ is 2.5 $\mu$m.

* * * * *